United States Patent
Okabe et al.

(10) Patent No.: US 10,670,933 B2
(45) Date of Patent: Jun. 2, 2020

(54) ACTIVE MATRIX SUBSTRATE, METHOD FOR PRODUCING SAME, AND DISPLAY DEVICE

(71) Applicant: Sharp Kabushiki Kaisha, Sakai, Osaka (JP)

(72) Inventors: Tohru Okabe, Sakai (JP); Hirohiko Nishiki, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/091,226

(22) PCT Filed: May 2, 2017

(86) PCT No.: PCT/JP2017/017229
§ 371 (c)(1),
(2) Date: Oct. 4, 2018

(87) PCT Pub. No.: WO2017/195699
PCT Pub. Date: Nov. 16, 2017

(65) Prior Publication Data
US 2019/0129267 A1    May 2, 2019

(30) Foreign Application Priority Data

May 10, 2016    (JP) ................................ 2016-094281

(51) Int. Cl.
*G02F 1/1362*    (2006.01)
*G02F 1/1368*    (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
None
See application file for complete search history.

(56) References Cited

U.S. PATENT DOCUMENTS

| | | |
|---|---|---|
| 2013/0069061 A1 | 3/2013 | Nakazawa |
| 2013/0207101 A1* | 8/2013 | Yamazaki ........... H01L 29/7869 257/43 |
| 2015/0206979 A1 | 7/2015 | Shimada et al. |

FOREIGN PATENT DOCUMENTS

| | | |
|---|---|---|
| JP | 2010-243594 A | 10/2010 |
| WO | 2011/151970 A1 | 12/2011 |
| WO | 2014/042125 A1 | 3/2014 |

OTHER PUBLICATIONS

Official Communication issued in International Patent Application No. PCT/JP2017/017229, dated Aug. 8, 2017.

* cited by examiner

*Primary Examiner* — Zandra V Smith
*Assistant Examiner* — Lawrence C Tynes, Jr.
(74) *Attorney, Agent, or Firm* — Keating & Bennett, LLP

(57) ABSTRACT

Provided are an active-matrix substrate having a reliable line connection structure, a method for producing the same, and a display device including the same.
A first metal line 122 and a second metal line 125 are electrically connected via an IGZO layer 124 rendered conductive. In this case, the second metal line 125 is isolated from an ITO layer 109 without contacting the ITO layer 109 because there are a passivation layer 107 and an organic insulating film 108 formed between the second metal line 125 and the ITO layer 109. Thus, no contact fault due to electric corrosion occurs between an aluminum layer 125a of the second metal line 125 and the ITO layer 109, whereby a reliable line connection structure is achieved.

10 Claims, 15 Drawing Sheets

(51) Int. Cl.
  *G02F 1/1333* (2006.01)
  *H01L 27/12* (2006.01)
  *H01L 21/768* (2006.01)
  *H01L 23/522* (2006.01)
  *H01L 29/786* (2006.01)
(52) U.S. Cl.
  CPC .......... *H01L 21/768* (2013.01); *H01L 23/522* (2013.01); *H01L 27/1225* (2013.01); *H01L 29/786* (2013.01); *G02F 1/136227* (2013.01); *G02F 2001/136295* (2013.01)

(A)

(B)

(A)

(B)

(C)

(A)

(B)

(A)

(B)

(C)

(A)

(B)

(A)

(B)

(C)

(A)

(B)

(A)

(B)

(C)

(A)

(B)

ACTIVE MATRIX SUBSTRATE, METHOD FOR PRODUCING SAME, AND DISPLAY DEVICE

TECHNICAL FIELD

The present invention relates to active-matrix substrates, methods for producing the same, and display devices, particularly to an active-matrix substrate, a method for producing the same, and a display device, all of which render it possible to prevent a contact fault due to electric corrosion from occurring.

BACKGROUND ART

When a plurality of metal lines are formed by a metal film in the same layer, the metal lines might cross each other. In such a case, the crossing of two metal lines can be avoided by coupling one of the two metal lines to a metal line formed by a metal film in another layer. Coupling a metal line in one layer to a metal line in another layer as above requires the metal line that is made of a metal film in one layer and the metal line that is made of a metal film in another layer to be connected to a connection line made of a metal film in still another layer.

However, depending on the combination of metal layers included in the metal lines and the connection line, contact faults due to electric corrosion might occur where the metal lines and the connection line contact each other. FIG. 15 provides views illustrating a conventional line connection structure 250; more specifically, FIG. 15(A) is a cross-sectional view of the conventional line connection structure 250, and FIG. 15(B) is a plan view of the conventional line connection structure 250. As shown in FIGS. 15(A) and 15(B), a first metal line 222, which is made of a film stack of an aluminum (Al) layer and a molybdenum (Mo) layer provided thereon, is formed on an insulating substrate 201 such as a glass substrate. Formed on the first metal line 222 is a gate insulating film 203 covering the first metal line 222 on each end portion.

On the gate insulating film 203 formed on one end portion, a second metal line 225 is formed of, for example, a film stack of an aluminum (Al) layer 225a and a molybdenum nitride (MoN) layer 225b provided thereon, and further, on the second metal line 225, a passivation layer 207 and an organic insulating film 208 are stacked. On the gate insulating film 103 formed on the other end portion, no second metal line 225 is formed, and the passivation layer 207 and the organic insulating film 208 are simply stacked. In this manner, the passivation layer 207 and the organic insulating film 208 surround an area provided as a contact hole 240.

Formed on an inner surface of the contact hole 240 is an ITO (indium tin oxide) layer 209 made of a transparent metal. By the ITO layer 209, the aluminum layer 225a, which is included in the second metal line 225 and protrudes into the contact hole 240, and the first metal line 222 are electrically connected via an opening 203c provided in the gate insulating film 203. As a result, the ITO layer 209 can serve as a connection line to couple the first metal line 222 and the second metal line 225.

Furthermore, Patent Document 1 discloses that either a hydrogen plasma treatment or an argon plasma treatment is performed on an IGZO (InGaZnO: indium gallium zinc oxide) film, which is an oxide semiconductor, thereby rendering the IGZO film conductive.

CITATION LIST

Patent Document

Patent Document 1: Japanese Laid-Open Patent Publication No. 2010-243594

SUMMARY OF THE INVENTION

Problems to be Solved by the Invention

In the line connection structure 250 shown in FIG. 15, the aluminum layer 225a of the second metal line 225 contacts the ITO layer 209 within the contact hole 240. Accordingly, a contact fault due to electric corrosion might occur where the aluminum layer 225a and the ITO layer 209 are in contact, with the result that the line connection structure 250 becomes less reliable. Moreover, Patent Document 1 does not disclose that the IGZO film rendered conductive by, for example, a hydrogen plasma treatment is used as a connection line for electrically connecting different metal lines.

Therefore, an objective of the present invention is to provide an active-matrix substrate having a reliable line connection structure, a method for producing the same, and a display device.

Solution to the Problems

One aspect of the present invention is directed to an active-matrix substrate, including:
a first metal line formed on an insulating substrate;
a first insulating film formed on the first metal line and having a first opening;
an oxide semiconductor layer formed on the first insulating film and rendered conductive;
a second metal line formed so as to be connected to an end of the conductive oxide semiconductor layer;
a second insulating film covering at least a top surface of the second metal line and having a second opening vertically above the first opening; and
a third metal line formed on an inner surface of the second opening, wherein,
the first metal line lies vertically below the first opening,
the second metal line lies vertically below the second insulating film and does not overlap the second opening,
the conductive oxide semiconductor layer contacts the second metal line in a region vertically below the second insulating film and extends to a region vertically below the first opening, and
the third metal line overlaps the first metal line within the first opening and contacts the conductive oxide semiconductor layer within the second opening, whereby the first metal line and the second metal line are electrically connected via at least the conductive oxide semiconductor layer.

Another aspect of the present invention is directed to a method for producing an active-matrix substrate, including the steps of:
forming a first metal line on an insulating substrate;
forming a first insulating film on the first metal line so as to have a first opening;
forming an oxide semiconductor layer on the first insulating film;
forming a second metal line so as to contact an end of the oxide semiconductor layer;

forming a second insulating film so as to have a second opening vertically above the first opening and cover at least a top surface of the second metal line;

rendering the oxide semiconductor layer conductive; and forming a third metal line so as to contact the oxide semiconductor layer within the second opening and overlap the first metal line within the first opening, wherein, the oxide semiconductor layer has first, second, and third regions, the first region being covered by the second metal line, the second region being positioned between the first and third regions and having the second insulating film on a top surface, the third region lying vertically below the second opening, and in the step of rendering the oxide semiconductor layer conductive, the second and third regions are subjected to a hydrogen or argon plasma treatment.

Yet another aspect of the present invention is directed to a method for producing an active-matrix substrate, including the steps of:

forming a first metal line on an insulating substrate;

forming a first insulating film on the first metal line so as to have a first opening;

forming an oxide semiconductor layer on the first insulating film;

forming a second metal line and a second insulating film such that the second metal line contacts an end of the oxide semiconductor layer, and the second insulating film has a second opening vertically above the first opening;

rendering the oxide semiconductor layer conductive; and forming a third metal line so as to contact the oxide semiconductor layer within the second opening and overlap the first metal line within the first opening, wherein, the step of forming the second metal line and the second insulating film includes:

forming a metal film covering the first insulating film and the oxide semiconductor layer;

forming an insulating film on the metal film;

forming the second insulating film and the second metal line by successively etching the insulating film and the metal film; and etching the second metal line so as to have an end more distant from the second opening than is an end of the second insulating film.

Another aspect which differs from any aspect of the present invention is directed to a display device including:

a display panel including an active-matrix substrate of claim 3 and a substrate bonded so as to be opposed to the active-matrix substrate;

a scanning signal line driver circuit configured to sequentially select a plurality of scanning signal lines; and a data signal line driver circuit configured to write image signal voltages to a plurality of data signal lines, the image signal voltages being generated on the basis of externally inputted image data, wherein, the active-matrix substrate includes the scanning signal lines, the data signal lines, each crossing the scanning signal lines, and a plurality of pixel forming portions disposed corresponding to intersections of the scanning signal lines and the data signal lines, the pixel forming portion includes a channel-etched thin-film transistor having a channel layer and the second insulating film formed on the channel layer, the channel layer being made of an oxide semiconductor rendered semiconductive, and the oxide semiconductor layer has first, second, and third regions, the first region being covered by the second metal line, the second region being positioned between the first and third regions and having the second insulating film on a top surface, the third region lying vertically below the second opening, and the second region has a length less than a thickness of the second insulating film formed on the thin-film transistor.

Effect of the Invention

In the one aspect, the first metal line and the second metal line are connected via at least the conductive oxide semiconductor layer, and the second metal line is not directly connected to the third metal line. Accordingly, no contact fault due to electric corrosion occurs between the second metal line and the third metal line. Thus, the first metal line and the second metal line are connected by such a reliable line connection structure.

In the another aspect, the second insulating film is formed on the second region of the oxide semiconductor layer, which is positioned between the first region covered by the second metal line and the third region having an exposed surface. In the step of performing the plasma treatment, the hydrogen or argon plasma reaches the second region through the second insulating film, and therefore, the oxide semiconductor layer is entirely rendered conductive. The first metal line and the second metal line are electrically connected via such an oxide semiconductor, and therefore, the second metal line and the third metal line are not directly connected. Consequently, no contact fault due to electric corrosion occurs between the second metal line and the third metal line, and therefore, the first metal line and the second metal line can be connected by such a reliable line connection structure.

In the yet another aspect, when the hydrogen or argon plasma treatment is performed, the oxide semiconductor layer is directly exposed to the plasma and therefore can be more reliably rendered conductive. Consequently, as in the eighth invention, no contact fault due to electric corrosion occurs between the second metal line and the third metal line, and therefore, the first metal line and the second metal line can be connected by such a reliable line connection structure. Moreover, it is possible to set a larger margin of alignment for an exposure process for forming a resist pattern to be used as a mask when the second insulating film is etched, whereby rework can be reduced during the exposure process.

In the another aspect which differs from any aspect, the oxide semiconductor layer is formed such that the surface of the first region is covered by the second metal line, the second region has the second insulating film formed thereon and is positioned between the first region and the third region having an exposed surface, and the length of the second region is shorter than the thickness of the second insulating film formed on the thin-film transistor. In this case, the plasma generated during the plasma treatment step passes through the second insulating film on the second region but does not pass through the second insulating film on the thin-film transistor, with the result that the oxide semiconductor layer connecting the first metal line and the second metal line is rendered conductive, but the channel layer of the thin-film transistor remains a semiconductor layer without being rendered conductive. Thus, the first metal line and the second metal line can be connected via the oxide semiconductor layer so as not to cause any contact fault due to electric corrosion, whereby the thin-film transistor can operate normally as a transistor.

MODES FOR CARRYING OUT THE INVENTION

1. First Embodiment

<1.1 Configuration and General Operation of the Liquid Crystal Display Device>

Figure 1:
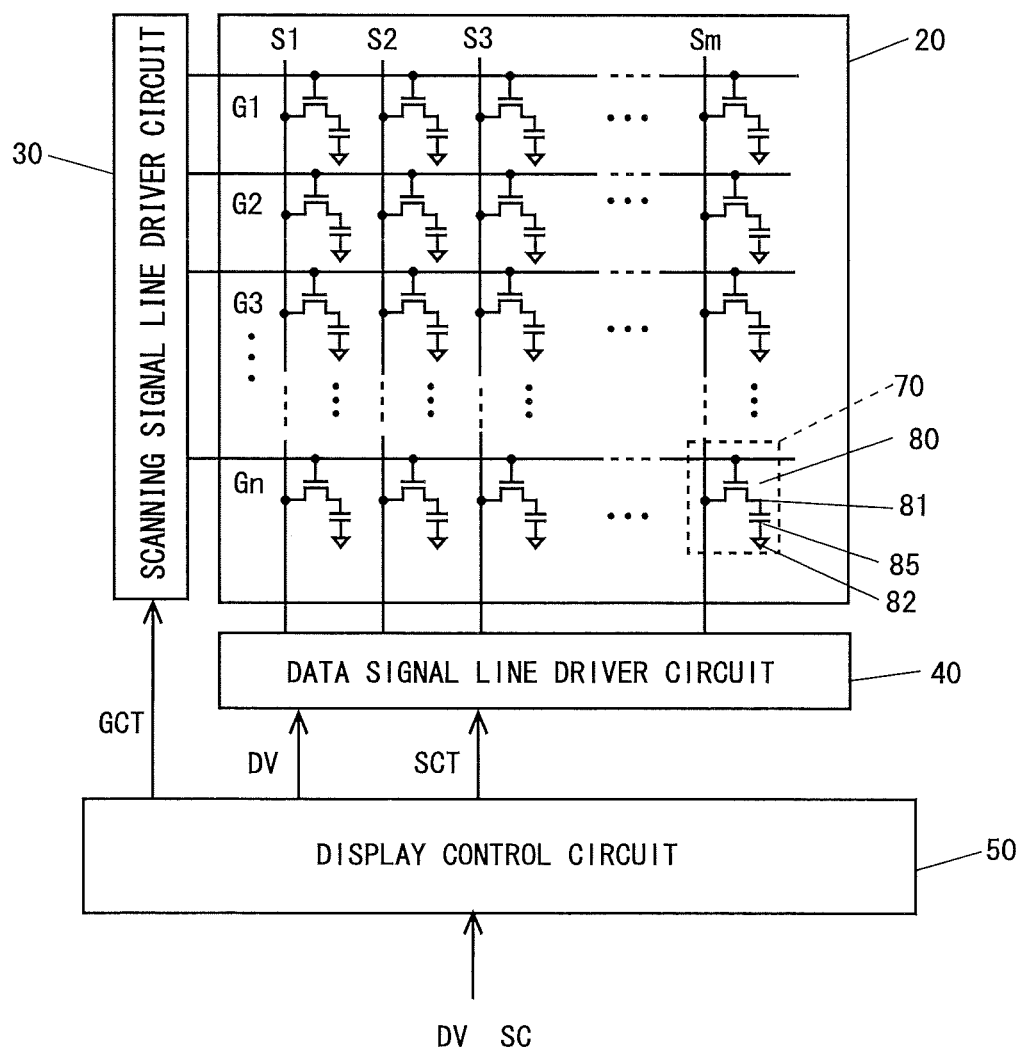
FIG. 1 is a block diagram illustrating the configuration of a liquid crystal display device including an active-matrix substrate according to a first embodiment of the present invention.

FIG. 1 is a block diagram illustrating the configuration of a liquid crystal display device 10 including an active-matrix substrate according to a first embodiment of the present invention. The liquid crystal display device 10 includes a liquid crystal panel 20, a scanning signal line driver circuit 30, a data signal line driver circuit 40, and a display control circuit 50, as shown in FIG. 1, and the liquid crystal panel 20 is formed by bonding an active-matrix substrate and a color filter substrate, as will be described later.

The liquid crystal panel 20 has formed therein m data signal lines $S_1$ to $S_m$, n scanning signal lines $G_1$ to $G_n$, and (m×n) pixel forming portions 70 disposed corresponding to intersections of the data signal lines $S_1$ to $S_m$ and the scanning signal lines $G_1$ to $G_n$. The pixel forming portions 70 include thin-film transistors (TFTs) 80, which have gate electrodes connected to the scanning signal lines $G_1$ to $G_n$ passing through corresponding intersections and source electrodes connected to the data signal lines $S_1$ to $S_m$ passing through the intersections, pixel electrodes 81 connected to drain electrodes of the TFTs 80, a common electrode 82 provided in common for the pixel forming portions 70, and a liquid crystal layer (not shown) sandwiched between the pixel electrodes 81 and the common electrode 82. The pixel electrodes 81 and the common electrode 82, along with the liquid crystal layer sandwiched therebetween, constitute liquid crystal capacitors 85 for holding written image signal voltages.

Furthermore, in the first embodiment, for a channel layer of the TFT 80, an oxide semiconductor, in particular, an IGZO film, is used with a view to taking advantage of the channel layer being rendered conductive (conductivity induction) or changed from a conductor to a semiconductor (semiconductivity induction) when the channel layer is subjected to a plasma treatment or a heat treatment. Note that the oxide semiconductor will be described herein as InGaZnO (indium gallium zinc oxide; referred to below as "IGZO"), which is an In—Ga—Zn—O based semiconductor, but the oxide semiconductor may be any of the oxide semiconductors that will be described below.

In the present invention, the oxide semiconductor that can be used instead of the IGZO film may be, for example, an In—Sn—Zn—O based semiconductor (e.g., $In_2O_3$—$SnO_2$—ZnO or InSnZnO). The In—Sn—Zn—O based semiconductor is a ternary oxide composed of In (indium), Sn (tin), and Zn (zinc). Moreover, the oxide semiconductor that can be used instead of the IGZO film may be, for example, an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, or an Hf—In—Zn—O based semiconductor.

When image data DV, which represents an image to be displayed, and control signals SC, such as a vertical synchronization signal and a horizontal synchronization signal, are inputted to the liquid crystal display device 10, the display control circuit 50 generates a data signal line driver circuit control signal SCT, a scanning signal line driver circuit control signal GCT, etc., on the basis of the control signals SC. The data signal line driver circuit control signal SCT is provided to the data signal line driver circuit 40, and the scanning signal line driver circuit control signal GCT is provided to the scanning signal line driver circuit 30.

In response to the data signal line driver circuit control signal SCT, the data signal line driver circuit 40 generates and outputs image signal voltages to be provided to the data signal lines $S_1$ to $S_m$, on the basis of the image data DV provided by the display control circuit 50. The data signal line driver circuit control signal SCT includes, for example, a source start pulse signal, a source clock signal, and a latch strobe signal. The image signal voltages are generated by unillustrated internal components, such as a shift register and a sampling circuit, being activated in accordance with such a data signal line driver circuit control signal SCT, and converting the image data DV into analog signals through an unillustrated D/A conversion circuit. The generated image signal voltages are outputted to the data signal lines $S_1$ to $S_m$ of the liquid crystal panel 20.

In response to the scanning signal line driver circuit control signal GCT, the scanning signal line driver circuit 30 repeats applying active scanning signals sequentially to the scanning signal lines $G_1$ to $G_n$, in predetermined cycles. The scanning signal line driver circuit control signal GCT includes, for example, a gate clock signal and a gate pulse signal. The scanning signal line driver circuit 30 generates the scanning signals by activating unillustrated internal components, such as a shift register, in accordance with the gate clock signal and the gate pulse signal.

In this manner, the image signal voltages are applied to the data signal lines $S_1$ to $S_m$, and the scanning signals are applied to the scanning signal lines $G_1$ to $G_n$, with the result that the liquid crystal panel 20 displays the image based on the externally inputted image data DV.

<1.2 Structure of the Liquid Crystal Panel>

Figure 2:
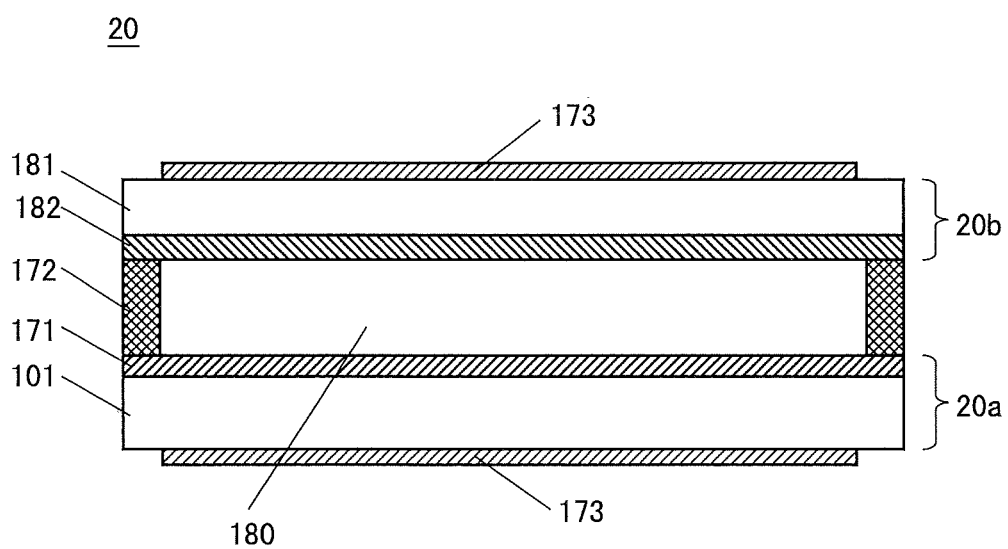
FIG. 2 is a cross-sectional view illustrating the structure of a liquid crystal panel included in the liquid crystal display device shown in FIG. 1.

FIG. 2 is a cross-sectional view illustrating the structure of the liquid crystal panel 20. In the liquid crystal panel 20, an active-matrix substrate 20a and a color filter substrate 20b are bonded, and liquid crystal 180 is injected in a space sealed by a sealant 172, as shown in FIG. 2. The active-matrix substrate 20a includes an insulating substrate 101 in which the pixel forming portions 70, the scanning signal lines $G_1$ to $G_n$, and the data signal lines $S_1$ to $S_m$, all of which are not shown, are formed on an inside surface, and an orientation film 171 is formed so as to cover these elements. The orientation film 171 controls orientation of liquid crystal molecules. The insulating substrate 101 has a polarizing plate 173 attached on an outside surface. Moreover, the color filter substrate 20b includes an insulating substrate 181 in which a color filter 182 is formed on an inside surface, whereby the liquid crystal display device 10 can display a color image. The insulating substrate 181 has a polarizing plate attached to an outside surface.

<1.3 Structure of the TFT>

Figure 3:
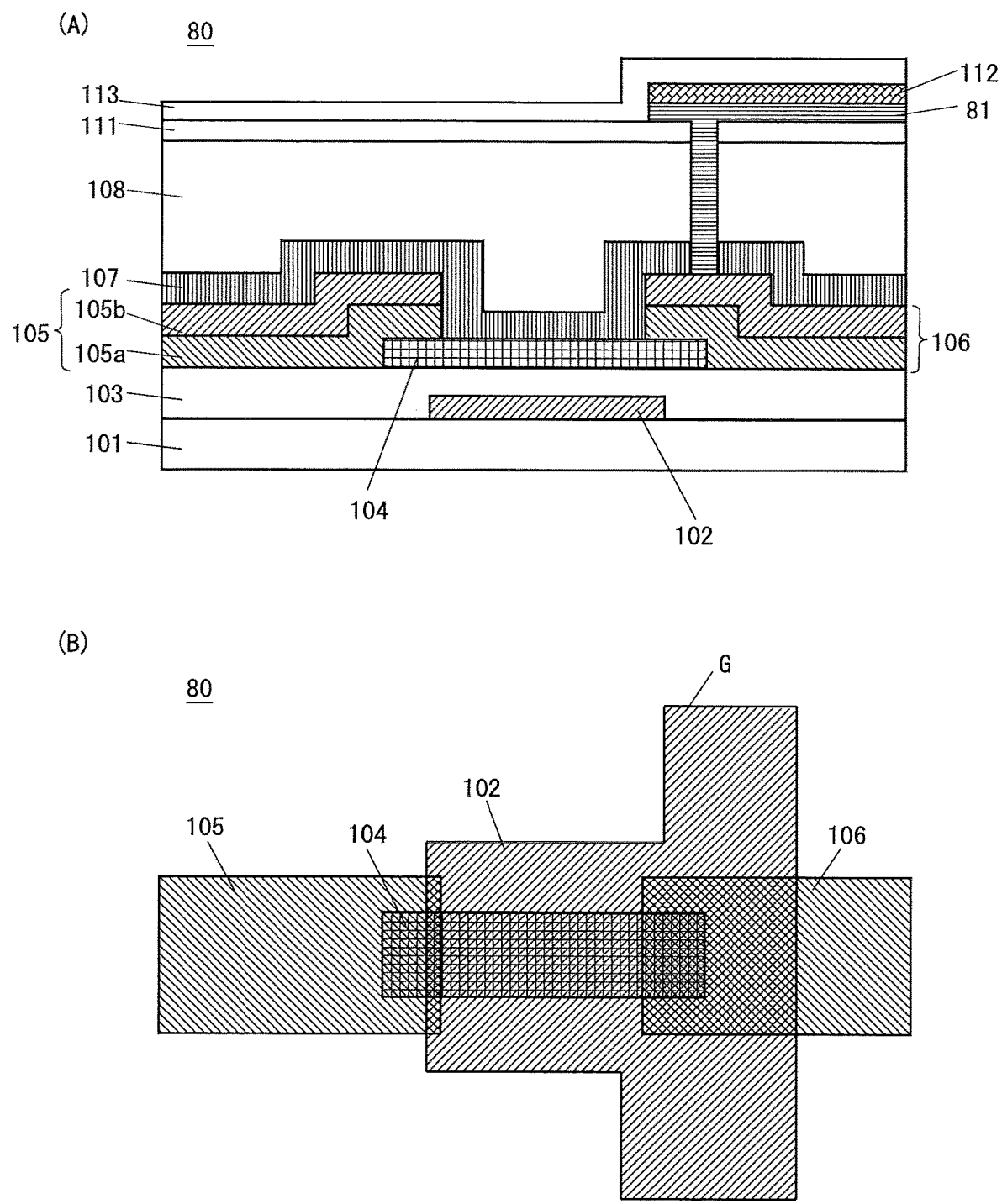
FIG. 3 provides views illustrating the structure of a channel-etched TFT formed in the liquid crystal panel of the liquid crystal display device; more specifically, part (A) is a cross-sectional view of the TFT, and part (B) is a plan view of the TFT.

FIG. 3 provides views illustrating the structure of the TFT 80, which is of a channel-etched type and formed in the liquid crystal panel 20 of the liquid crystal display device 10; more specifically, FIG. 3(A) is a cross-sectional view of the TFT 80, and FIG. 3(B) is a plan view of the TFT 80. As shown in FIG. 3, formed on the insulating substrate 101, which is, for example, a glass substrate, is a gate electrode 102 made of a film stack of an aluminum film and a molybdenum film provided thereon. A gate insulating film 103 is formed of a film stack of a silicon nitride (SiNx) film and a silicon oxide ($SiO_2$) film provided thereon, so as to cover the gate electrode 102.

Formed on the gate insulating film 103 is a channel layer 104 made of an IGZO film. Formed on opposite end portions of the channel layer 104 are a source electrode 105 and a drain electrode 106, which are disposed so as to be opposed to each other at a predetermined distance on the channel layer 104. Note that the source electrode 105 and the drain electrode 106 are made of film stacks, each consisting of an aluminum layer 105a and a molybdenum nitride (MoN) layer 105b provided thereon.

Furthermore, a passivation layer 107 is formed so as to cover an entire surface including the source electrode 105 and the drain electrode 106. Formed on the passivation layer 107 is an organic insulating film 108 made of acrylic or the like, and formed on the organic insulating film 108 are a passivation layer 111 and a pixel electrode 81. The pixel electrode 81 is made of an ITO film, which is a transparent metal, and electrically connected to the drain electrode 106 through a contact hole provided in the organic insulating film 108 and the passivation layer 107. Formed on the pixel electrode 81 is a metal line layer 112, and further, a passivation layer 113 is formed so as to cover an entire surface of the TFT 80. Note that as a connection line, an IZO (indium zinc oxide) layer may be formed in place of an ITO film. Moreover, the composition of the film stack that forms each electrode described above is not limited to the above, and other compositions may be employed.

IGZO films formed by sputtering are rendered conductive by performing a hydrogen plasma treatment or an argon plasma treatment on the IGZO film or by heating the insulating substrate 101 when forming the insulating film. Such an IGZO film is used for the channel layer 104 of the TFT 80, as well as for a connection line intended to, as will be described later, keep two metal lines made of a metal film in the same layer from crossing each other by coupling one line to a metal line made of a metal film in another layer. In the case where the IGZO film is used for the channel layer 104 of the TFT 80, the IGZO film needs to be changed from a conductor to a semiconductor, and in the case where the IGZO film is used for the connection line, the IGZO film needs to remain a conductor. Therefore, in the case of the channel layer 104 of the TFT 80, the IGZO film rendered conductive is positioned between silicon oxide films respectively included in the gate insulating film 103 and the passivation film, and the passivation film is annealed, for example, at 200 to 350° C., whereby the IGZO film is rendered semiconductive. In this case, the IGZO film used for the connection line is formed on the gate insulating film 103 and has no passivation film formed thereon. Accordingly, since the IGZO film is not positioned between silicon oxide films, the annealing does not render the IGZO film semiconductive and the IGZO film remains as a conductor.

<1.4 Structure of the Contact Portion>

Figure 4:
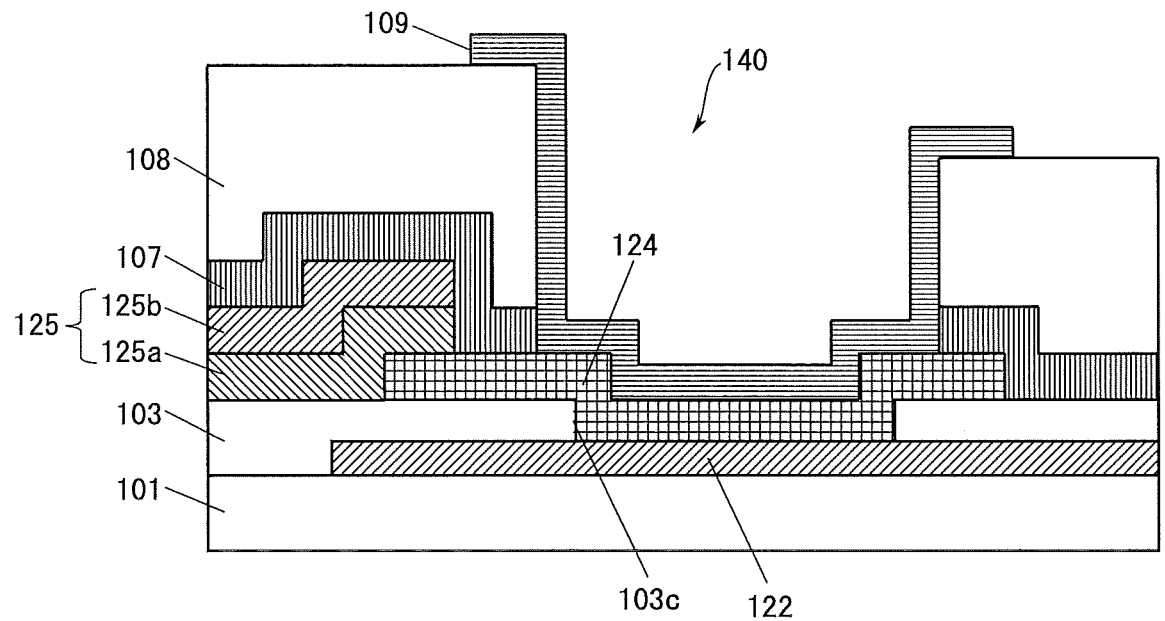
FIG. 4 provides views illustrating the configuration of a line connection structure included in the active-matrix substrate according to the first embodiment; more specifically, part (A) is a cross-sectional view of the line connection structure, and part (B) is a plan view of the line connection structure.
Figure 4:
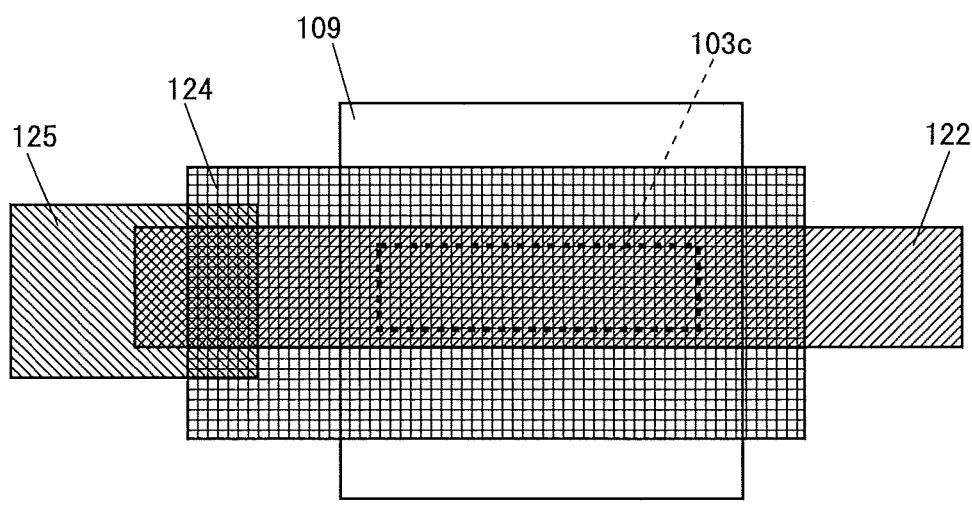

FIG. 4 provides views illustrating the configuration of a line connection structure 150 included in the active-matrix substrate 10a according to the first embodiment; more specifically, FIG. 4(A) is a cross-sectional view of the line connection structure 150, and FIG. 4(B) is a plan view of the line connection structure 150. As shown in FIGS. 4(A) and 4(B), formed on the insulating substrate 101 is a first metal line 122 extending from a portion peripheral to the contact hole 140 (first peripheral portion) through the contact hole 140 to another peripheral portion (second peripheral portion), and the gate insulating film 103 is formed so as to cover both ends of the first metal line 122. The gate insulating film 103 has an opening 103c provided within the contact hole 140, whereby in the opening 103c, a top surface of a first metal line 122 is exposed. Formed on the gate insulating film 103, including the opening 103c, is an IGZO layer 124 extending from the first peripheral portion through the contact hole 140 to the second peripheral portion. Accordingly, the first metal line 122 and the IGZO layer 124 contact each other within the opening 103c of the gate insulating film 103.

In the first peripheral portion, a second metal line 125 extends so as to be situated on an end portion of the IGZO layer 124. The second metal line 125 is made of a film stack of an aluminum layer 125a and a molybdenum nitride layer 125b provided thereon, and the aluminum layer 125a has a bottom surface in contact with a top surface of the IGZO layer 124.

On the second metal line 125, the passivation layer 107 and the organic insulating film are stacked. The passivation layer 107 is, for example, a monolayer film simply made of a silicon oxide film or a film stack of a silicon oxide film and a silicon nitride film provided thereon. The organic insulating film 108 is made of, for example, acrylic, and provided for achieving a flat surface and reduced parasitic capacitance. The passivation layer 107 and the organic insulating film 108 not only cover a top surface of the second metal line 125 but also cover a side surface of the contact hole 140, but do not cover a surface of the IGZO layer 124 protruding from the first peripheral portion into the contact hole 140. Moreover, in the second peripheral portion external to the contact hole 140, the first metal line 122, the gate insulating film 103, the IGZO layer 124, the passivation layer 107, and the organic insulating film 108 are stacked in this order. Further, an ITO layer 109 is formed so as to extend from a surface of the first peripheral portion to a surface of the second peripheral portion and thereby cover the inner surface of the contact hole 140. Accordingly, the ITO layer 109 is in contact with the entire top surface of the IGZO layer 124 protruding into the contact hole 140.

In this manner, the IGZO layer 124 contacts the top surface of the first metal line 122 within the opening 103c provided in the gate insulating film 103 and also contacts the bottom surface of the aluminum layer 125a included in the second metal line 125 within the first peripheral portion. Accordingly, the first metal line 122 and the second metal line 125 are electrically connected via the IGZO layer 124. Therefore, when the IGZO layer 124 is conductive, the IGZO layer 124 serves as a connection line for electrically connecting the first metal line 122 and the second metal line 125. Inducing conductivity of the IGZO layer 124 will be described later. Moreover, in the present embodiment, since the ITO layer 109, which is formed so as to cover the inner surface of the contact hole 140, contacts the entire top surface of the IGZO layer 124 protruding into the contact hole 140, the first metal line 122 and the second metal line 125 are more reliably connected via the IGZO layer 124. Further, in the present embodiment, the aluminum layer 125a and the ITO layer 109 are out of contact with each other because the aluminum layer 125a and the ITO layer 109 are isolated by the passivation layer 107 and the organic insulating film 108, which are formed therebetween, and therefore, no contact fault due to electric corrosion occurs.

It should be noted that the opening 103c will also be referred to as the "first opening", and the contact hole 140 will also be referred to as the "second opening". The gate insulating film 103 will also be referred to as the "first insulating film", the IGZO layer 124 will also be referred to as the "oxide semiconductor layer", the passivation layer 107 and the organic insulating film 108 will also be referred to collectively as the "second insulating film", the passivation layer 107 will also be referred to as the "protective film", and the ITO layer 109 will also be referred to as the "third metal line". Moreover, the second metal line 125 positioned between the insulating substrate 101 and the set of the passivation layer 107 and the organic insulating film 108 will also be referred to as "the second metal line vertically below the second insulating film", and the IGZO layer 124 protruding into the contact hole 140 will also be referred to as "the oxide semiconductor layer overlapping the second opening".

<1.5 Production Method>

Figure 5:
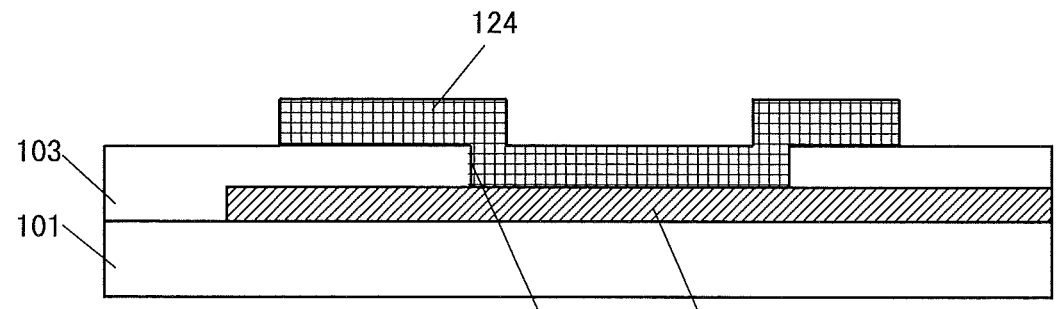
FIGS. 5(A) to 5(C) are cross-sectional views illustrating a method for producing the line connection structure shown in FIG. 4.
Figure 5:
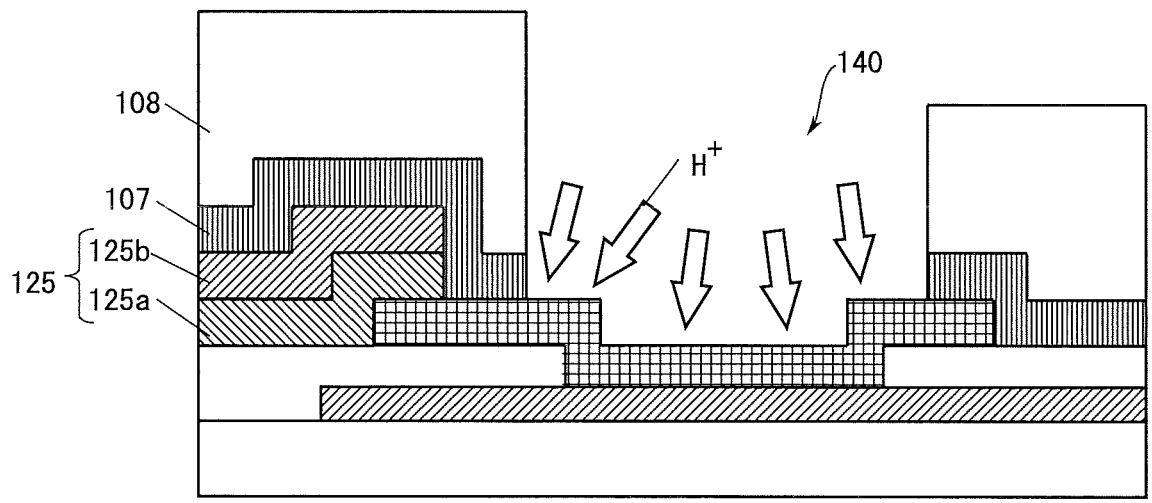
Figure 5:
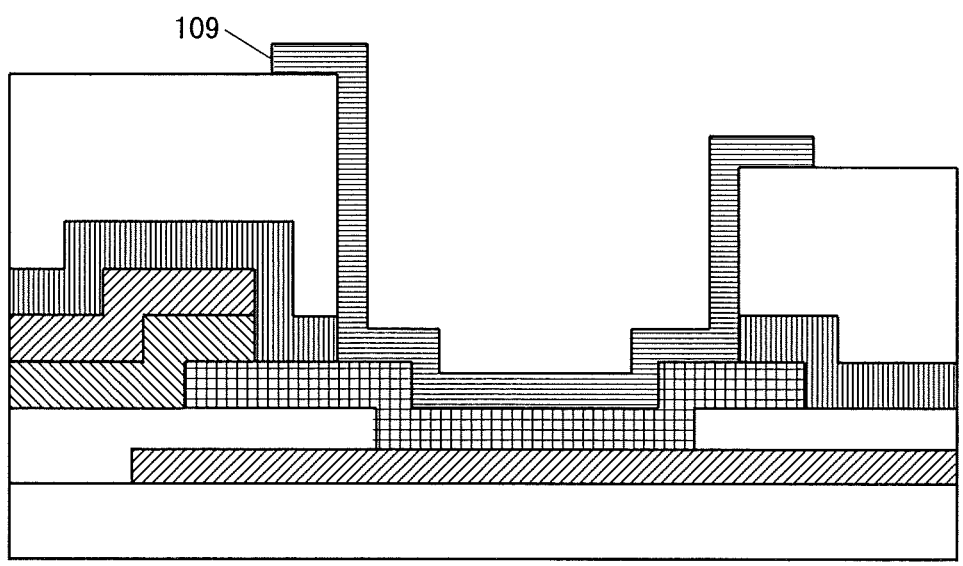

A method for producing the line connection structure 150 according to the first embodiment will be described in comparison with a method for producing the TFT 80. FIGS. 5(A) to 5(C) are cross-sectional views illustrating the method for producing the line connection structure 150 shown in FIG. 4. Initially, a first metal film is formed on an insulating substrate 101 and wet etched using a resist pattern as a mask, whereby a first metal line 122 is formed, as shown in FIG. 5(A). As for the TFT 80, at this stage, a gate electrode 102 is formed on the insulating substrate 101. Note that the first metal line 122 may be formed by dry etching, rather than by wet etching.

A gate insulating film 103 is formed so as to cover the first metal line 122, and then dry etched using a resist pattern as a mask, whereby an opening 103c is provided in the gate insulating film 103. On the gate insulating film 103, including the opening 103c, an IGZO film is formed by sputtering, and then wet etched using a resist pattern as a mask, whereby an IGZO layer 124 is formed. As a result, the first metal line 122 and the IGZO layer 124 contact each other within the opening 103c. As for the TFT 80, at this stage, a channel layer 104 made of an IGZO film is formed on the gate insulating film 103, which is formed so as to cover the gate electrode 102.

Next, an aluminum film and a molybdenum nitride film are sequentially stacked by sputtering and dry etched using a resist pattern as a mask, whereby a second metal line 125 is formed within a first peripheral portion as a stack of an aluminum layer 125a and a molybdenum nitride layer provided thereon, as shown in FIG. 5(B). At this time, since the aluminum film and the molybdenum nitride film are etched successively by the same step, the aluminum layer 125a and the molybdenum nitride layer 125b, when viewed in a direction vertical to the insulating substrate 101, are aligned at ends on the IGZO layer 124. As a result, a top surface of the IGZO layer 124 contacts a bottom surface of the aluminum layer 125a in the second metal line 125, whereby the first metal line 122 and the second metal line 125 are electrically connected by the IGZO layer 124 serving as a connection line. As for the TFT 80, at this stage, a source electrode 105 and a drain electrode 106 are formed at opposite ends of the channel layer 104.

Furthermore, a passivation film and an organic insulating film are sequentially formed so as to cover an entire surface of the substrate, and the passivation film is dry etched with the organic insulating film 108 serving as a mask after the organic insulating film 108 is patterned. As a result, a contact hole 140 is provided, and an end of the second metal line 125 formed within the first peripheral portion is completely covered by the passivation layer 107 and the organic insulating film 108, so that the second metal line 125 does not protrude into the contact hole 140. As for the TFT 80, at this stage, the passivation layer 107 and the organic insulating film 108 are formed as well so as to cover the source electrode 105 and the drain electrode 106. Moreover, the contact hole 140 is provided so as to reach the drain electrode 106. In this state, a plasma treatment is performed using, for example, a hydrogen plasma $H^+$. As will be described in detail later, not only an area of the IGZO layer 124 that is not covered by the passivation layer 107 nor the organic insulating film 108 is directly exposed to the hydrogen plasma $H^+$, but also hydrogen ions $H^+$ in the hydrogen plasma reach an area of the IGZO layer 124 that is covered by the passivation layer 107 and the organic insulating film 108. As a result, the IGZO layer 124 is rendered conductive, so that the first metal line 122 and the second metal line 125 are electrically connected via the IGZO layer 124.

An ITO layer 109 is formed so as to extend from the first peripheral portion to a second peripheral portion and thereby cover an inner surface of the contact hole 140, as shown in FIG. 5(C). The ITO layer 109 contacts the IGZO layer rendered conductive, within the contact hole 140. As a result, the first metal line 122 and the second metal line 125 are electrically connected by the IGZO layer 124, which serves as a connection line, and the ITO layer 109. As for the TFT 80, at this stage, a pixel electrode 81 is formed so as to be connected to the drain electrode 106 through a contact hole provided simultaneously with the contact hole 140.

<1.6 Conductivity Induction for the IGZO Layer>

The IGZO layer 124 formed on the gate insulating film 103 is a conductor immediately after the formation, and changes to a semiconductor at a subsequent step for a heat treatment at 200 to 350° C. where the IGZO layer 124 is positioned between silicon oxide films. However, since the IGZO layer 124 is used as a connection line for electrically connecting the first metal line 122 and the second metal line 125, the IGZO layer 124 is required to be eventually rendered conductive. On the other hand, the IGZO film that serves as the channel layer 104 of the TFT 80 is required to be eventually rendered semiconductive.

Figure 6:
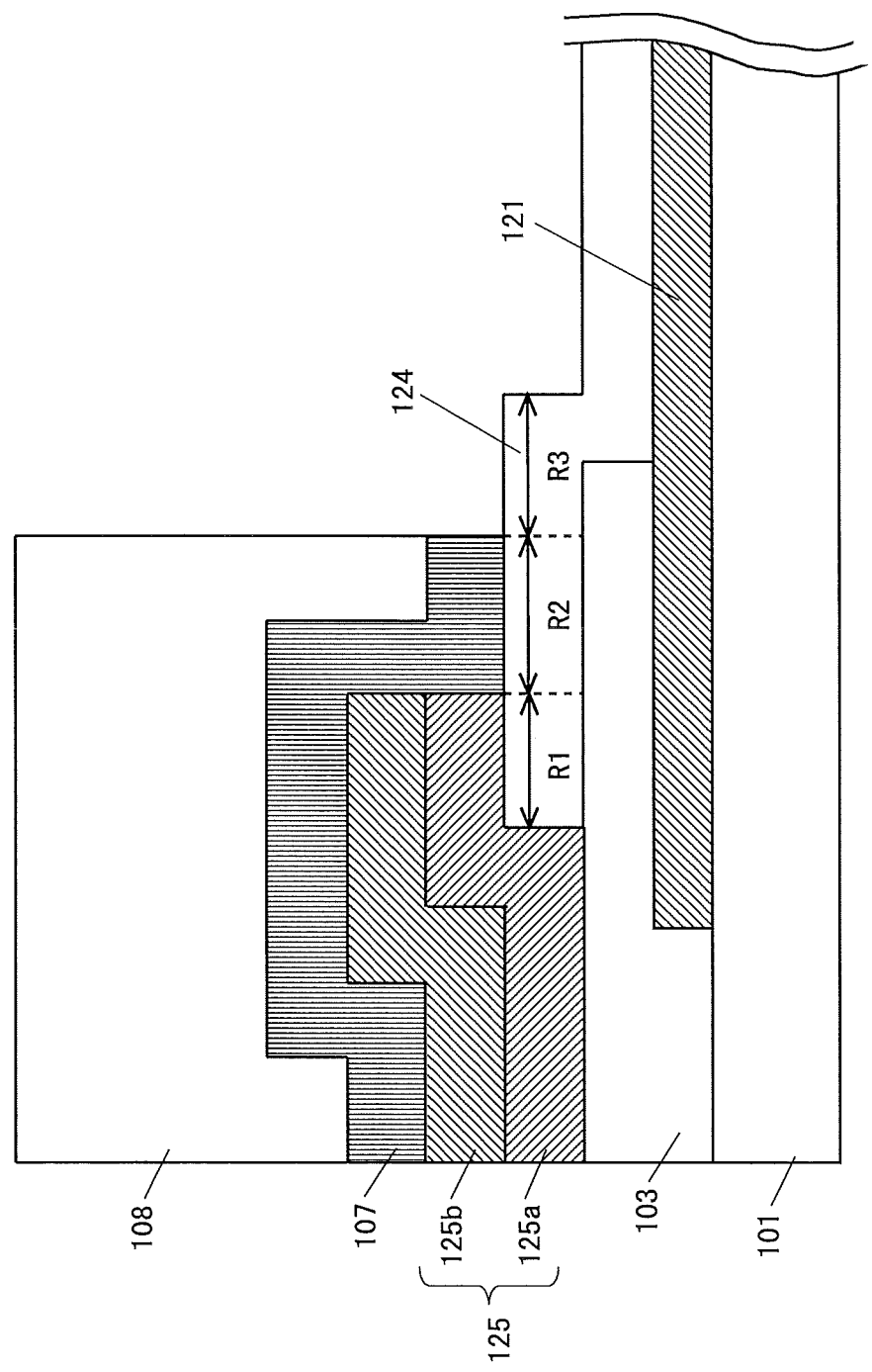
FIG. 6 is a cross-sectional view illustrating in enlargement a part of a first peripheral portion of the line connection structure shown in FIG. 4.

Accordingly, a method will be described by which the IGZO layer 124, which connects the first metal line 122 and the second metal line 125, is rendered conductive while the IGZO film that constitutes the channel layer 104 of the TFT 80 remains a semiconductor. FIG. 6 is a cross-sectional view illustrating in enlargement a part of the first peripheral portion of the line connection structure 150 shown in FIG. 4. The IGZO layer 124 will be described separately for three regions R1, R2, and R3 as shown in FIG. 6. Described first is the region (first region) R1 covered by the second metal line 125. In the first region R1, the top surface of the IGZO layer 124 is covered by the aluminum layer 125a and therefore is not positioned between silicon oxide films. Accordingly, even if the method includes the step of performing a heat treatment at 200 to 350° C. after the formation of the IGZO film, the IGZO layer 124 remains a conductor without being rendered semiconductive.

Furthermore, in the third region R3 protruding from the side surface of the contact hole 140 into the contact hole 140, the organic insulating film and the passivation film, which are formed on the region R3, are removed when the contact hole 140 is provided, so that the surface of the IGZO layer 124 is exposed. Accordingly, following such etching of the organic insulating film and the passivation film, a hydrogen plasma treatment is performed using the same plasma etching device as that used for the etching. As a result, the third region R3 of the IGZO layer 124 is directly exposed to the hydrogen plasma and thereby rendered conductive. Note that the plasma treatment for rendering the IGZO layer conductive is described herein as a hydrogen plasma treatment, but an argon plasma treatment may be performed instead of the hydrogen plasma treatment.

Figure 7:
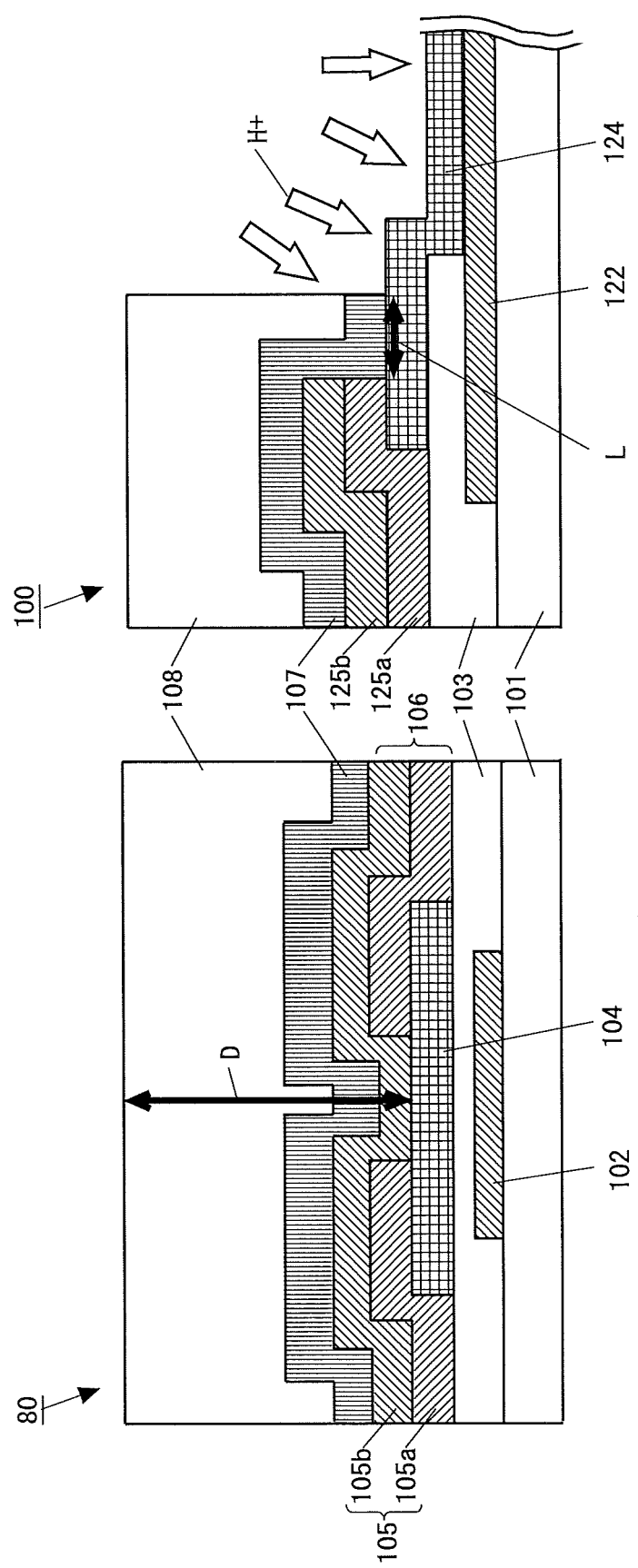
FIG. 7 is a view describing conductivity induction for an IGZO layer in the line connection structure shown in FIG. 4.

The second region R2 of the IGZO layer 124, which is positioned between the first region R1 and the third region R3, is covered by the passivation layer 107 and the organic insulating film 108. FIG. 7 is a view describing the conductivity induction for the IGZO layer 124 in the line connection structure 150 shown in FIG. 4. In the hydrogen plasma treatment performed for rendering the third region R3 conductive, hydrogen ions H included in the hydrogen plasma generated by the plasma etching device are incident on side surfaces of the passivation layer 107 and the organic insulating film 108 diagonally from above, as shown in FIG. 7, and pass therethrough to reach the IGZO layer 124, whereby the second region R2 is rendered conductive. At this time, if any portion of the second region R2 is not rendered conductive, the IGZO layer 124 fails to electrically connect the first metal line 122 and the second metal line 125, and therefore, the second region R2 is required to be rendered completely conductive.

As for the TFT 80, on the other hand, when the hydrogen ions $H^+$ in the hydrogen plasma pass through the organic insulating film 108 and the passivation layer 107 to reach the channel layer 104, the IGZO film that constitutes the channel layer 104 is rendered conductive as well. As a result, the TFT 80 is rendered in constant ON state and therefore becomes inoperable as a transistor.

Therefore, while letting the IGZO film, which constitutes the channel layer 104 of the TFT 80, remain a semiconductor, only the IGZO layer 124, which connects the first metal line 122 and the second metal line 125, is required to be rendered conductive. In this case, when the length of the second region R2 is denoted by L, and the total thickness of the organic insulating film 108 and the passivation layer 107 is denoted by D, the distance the hydrogen ions $H^+$ contained in the hydrogen plasma are transmitted is required to be adjusted so as to be longer than the length L but shorter than the thickness D.

Specifically, in the case where the organic insulating film 108 has a thickness of from 0.5 μm to 3 μm (typically, 2 μm), and the passivation layer 107 has a thickness of from 100 nm to 500 nm, the length L of the second region R2 is required to be less than or equal to 2 μm.

<1.7 Effects>

In the first embodiment, the first metal line 122 and the second metal line 125 are electrically connected by the IGZO layer 124 rendered conductive. In this case, the end of the second metal line 125 is covered by the passivation layer 107 and the organic insulating film 108 and does not protrude into the contact hole 140, and therefore, the second metal line 125 does not contact the ITO layer 109 formed on the inner surface of the contact hole 140. Accordingly, no contact fault due to electric corrosion occurs between the aluminum layer 125a in the second metal line 125 and the ITO layer 109. Thus, the first metal line 122 and the second metal line 125 are electrically connected by such a reliable line connection structure 150.

2. Second Embodiment

<2.1 Configuration of the Line Connection Structure>

Figure 8:
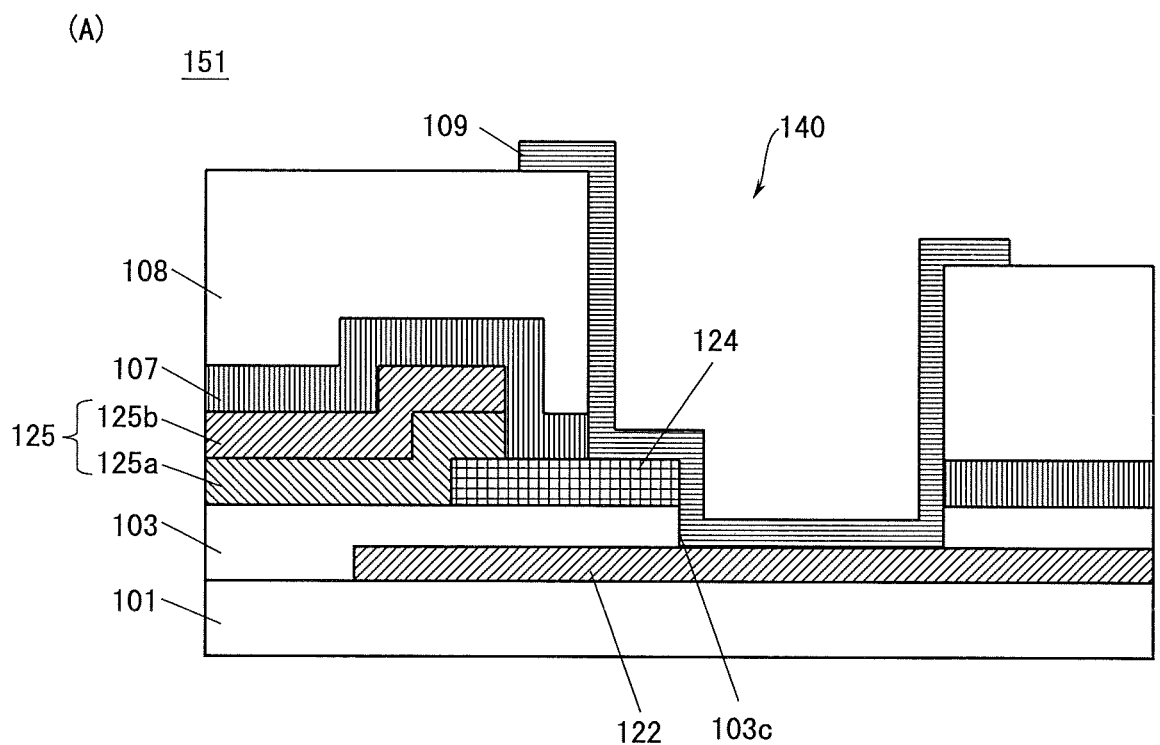
FIG. 8 provides views illustrating the configuration of a line connection structure included in an active-matrix substrate according to a second embodiment of the present invention; more specifically, part (A) is a cross-sectional view of the line connection structure, and part (B) is a plan view of the line connection structure.
Figure 8:
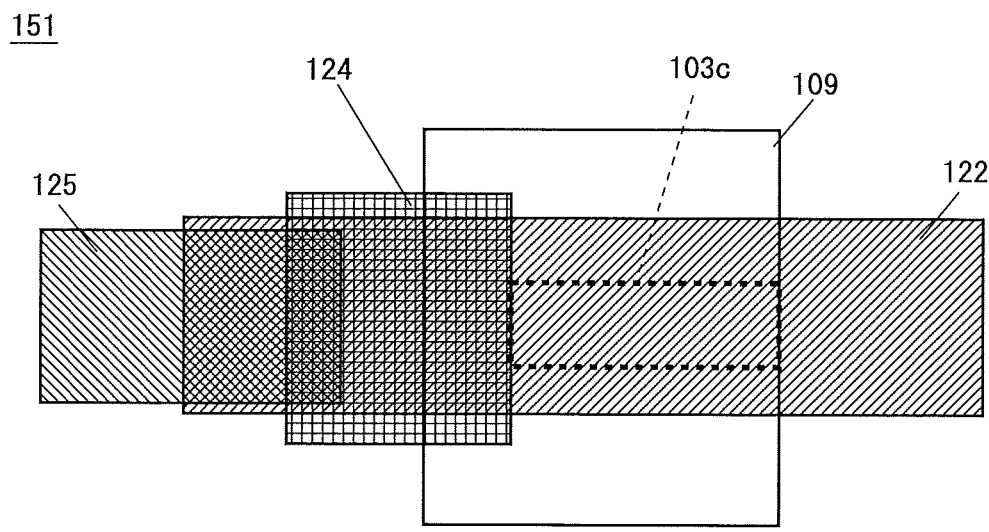

FIG. 8 provides views illustrating the configuration of a line connection structure 151 included in an active-matrix substrate 10a according to a second embodiment of the present invention; more specifically, FIG. 8(A) is a cross-sectional view of the line connection structure 151, and FIG. 8(B) is a plan view of the line connection structure 151. As shown in FIGS. 8(A) and 8(B), the line connection structure 151 in the present embodiment is configured in a similar manner to the line connection structure 150 shown in FIG. 4. Therefore, in FIGS. 8(A) and 8(B), elements of the line connection structure 151 that are the same as those of the line connection structure 150 are denoted by the same reference characters, hence any descriptions thereof will be omitted, and different elements will be described.

As in the case shown in FIG. 4, the opening 103c is provided in the gate insulating film 103 within the contact hole 140. An end of the IGZO layer 124 formed on the gate insulating film 103 is aligned with an end of the gate insulating film 103 when viewed in a direction vertical to the insulating substrate 101.

The bottom surface of the aluminum layer 125a in the second metal line 125 contacts the top surface of the IGZO layer 124, and within the contact hole 140, the IGZO layer 124 contacts the ITO layer 109, which is formed so as to extend from the surface of the first peripheral portion to the surface of the second peripheral portion and thereby cover the inner surface of the contact hole 140. Furthermore, the ITO layer 109 contacts the top surface of the first metal line 122 within the opening 103c. Accordingly, when the IGZO layer 124 is conductive, the second metal line 125 and the first metal line 122 are electrically connected via the IGZO layer 124 and the ITO layer 109 connected to the IGZO layer 124.

In this case also, since the end of the aluminum layer 125a in the second metal line 125 is covered by the passivation layer 107 and the organic insulating film 108 and therefore isolated from the ITO layer 109, the aluminum layer 125a does not contact the ITO layer 109. Thus, it is possible to prevent a contact fault due to electric corrosion from occurring between the aluminum layer 125a in the second metal line 125 and the ITO layer 109.

<2.2 Method for Producing the Line Connection Structure>

Figure 9:
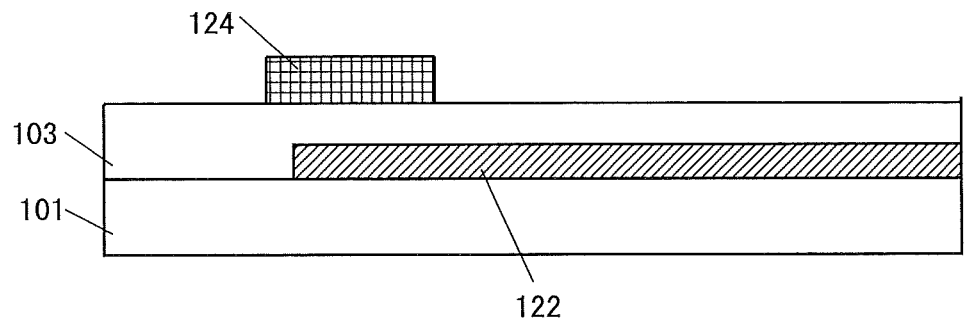
FIGS. 9(A) to 9(C) are cross-sectional views illustrating a method for producing the line connection structure shown in FIG. 8.
Figure 9:
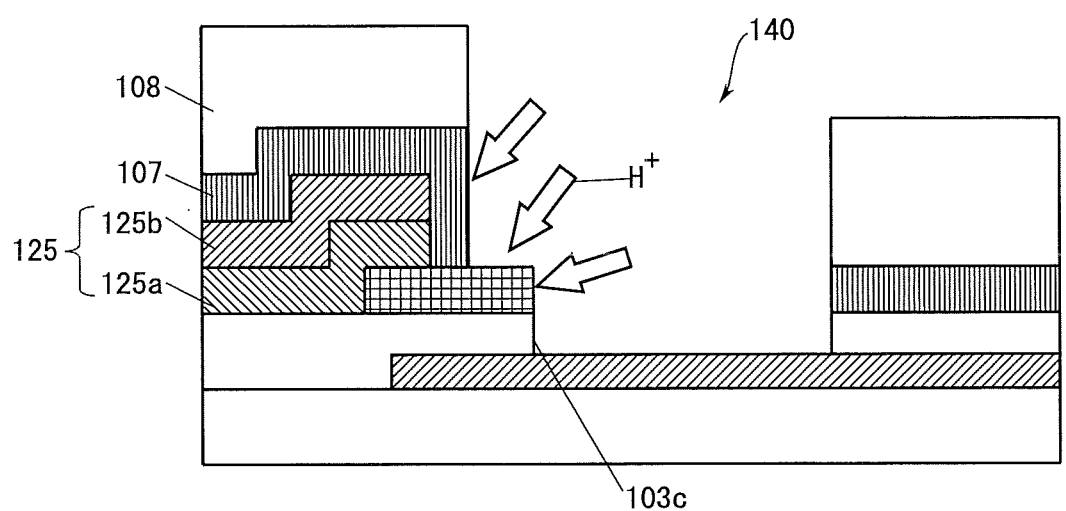
Figure 9:
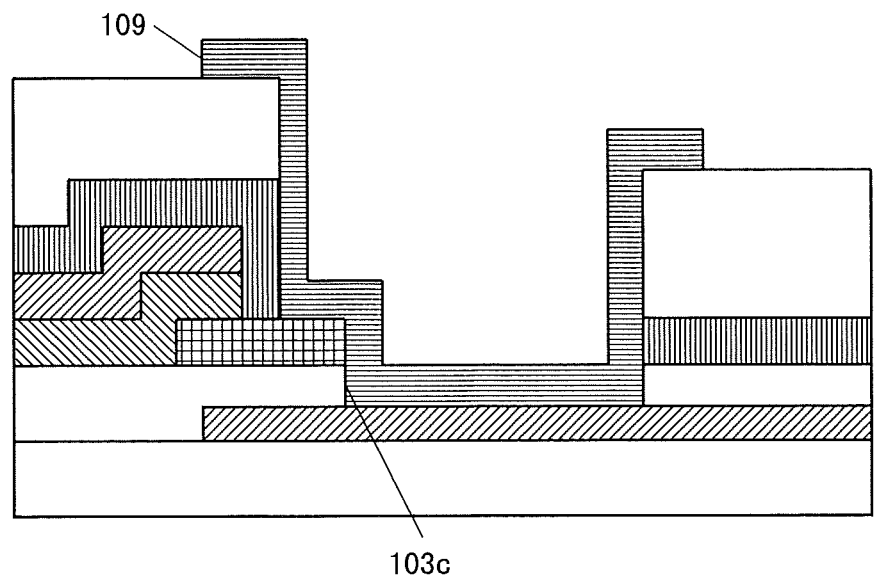

A method for producing the line connection structure 151 in the present embodiment will be described. FIGS. 9(A) to 9(C) are cross-sectional views illustrating the method for producing the line connection structure 151 shown in FIG. 8. Initially, a first metal line 122 is formed on an insulating substrate 101, and a gate insulating film 103 is formed so as to cover the first metal line 122, as shown in FIG. 9(A); these steps are the same as in the case shown in FIG. 5(A). Next, an IGZO film is formed without providing an opening in the gate insulating film 103, and then wet etched using a resist pattern as a mask. As a result, an IGZO layer 124 is formed.

As shown in FIG. 9(B), a second metal line 125 is formed, and then a passivation film and an organic insulating film are formed. Next, to provide a contact hole 140, the passivation film is dry etched with the organic insulating film 108 serving as a mask after the organic insulating film 108 is patterned, and further, the gate insulating film 103 is dry etched with the IGZO layer 124 serving as a mask. As a result, the passivation layer 107 and the organic insulating film 108 formed on the IGZO layer 124 protruding into the contact hole 140 are removed, so that a surface of the IGZO layer 124 is exposed. Moreover, an opening 103c is provided in the gate insulating film, so that a top surface of the first metal line 122 is exposed in the opening 103c, and an end of the IGZO layer 124 and an end of the gate insulating film 103 are aligned with each other when viewed in a direction vertical to the insulating substrate 101.

Furthermore, following the dry etching of the gate insulating film 103, a hydrogen plasma treatment is performed using the same dry etching device as that used for the dry etching. As a result, regions of the IGZO layer 124 that respectively correspond to the second and third regions R2 and R3 shown in FIG. 6 are rendered conductive. Moreover, a region of the IGZO layer 124 that corresponds to the first region R1 remains a conductor, and therefore, the IGZO layer 124 is rendered entirely conductive.

As shown in FIG. 9(C), an ITO layer 109 is formed so as to cover an inner surface of the contact hole 140. As a result, the first metal line 122 contacts the ITO layer 109 in contact with the IGZO layer 124 rendered conductive and contacting the second metal line 125, and therefore, the first metal line 122 and the second metal line 125 are electrically connected via the conductive IGZO layer 124 and the ITO layer 109.

<2.3 Effects>

The present embodiment renders it possible to achieve the same effects as those described in the first embodiment. Moreover, the opening 103c can be provided in the gate insulating film 103 by successively etching the gate insulating film 103 with the IGZO layer 124 serving as a mask after the passivation layer 107 and the organic insulating film 108 are removed from the IGZO layer 124 to provide the contact hole 140. Thus, there is no need to employ an additional step of providing the opening 103c in the gate insulating film 103, resulting in a shorter production process.

3. Third Embodiment

<3.1 Configuration of the Line Connection Structure>

Figure 10:
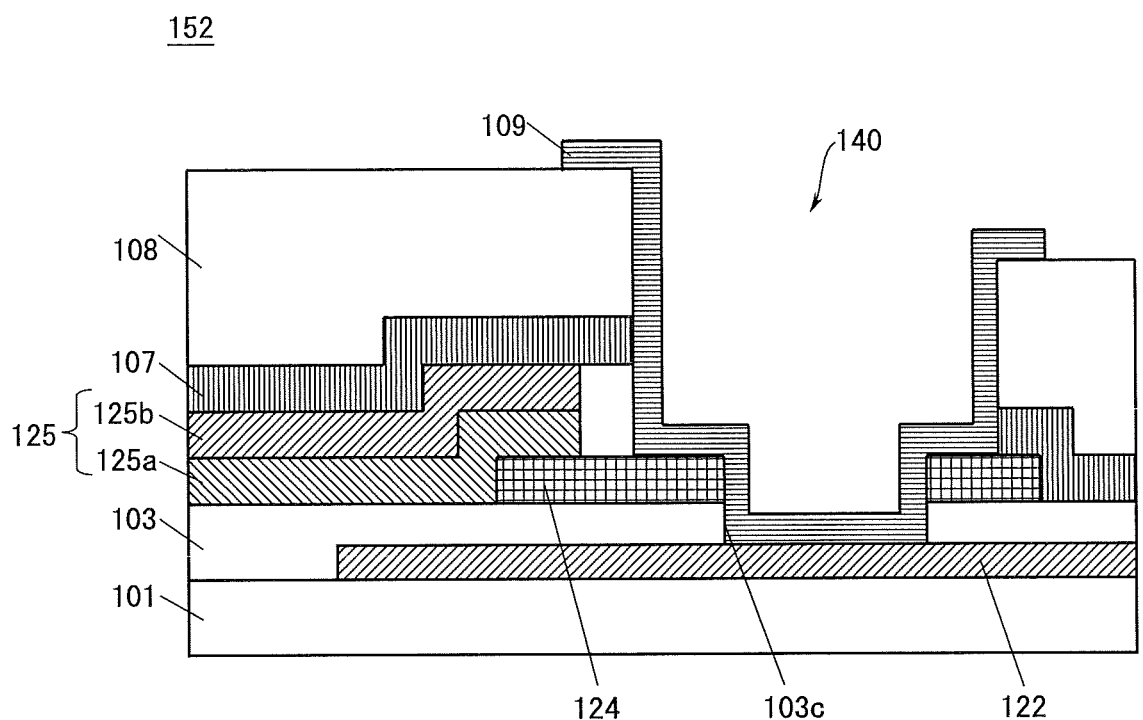
FIG. 10 provides views illustrating the configuration of a line connection structure included in an active-matrix substrate according to a third embodiment; more specifically, part (A) is a cross-sectional view of the line connection structure, and part (B) is a plan view of the line connection structure.
Figure 10:
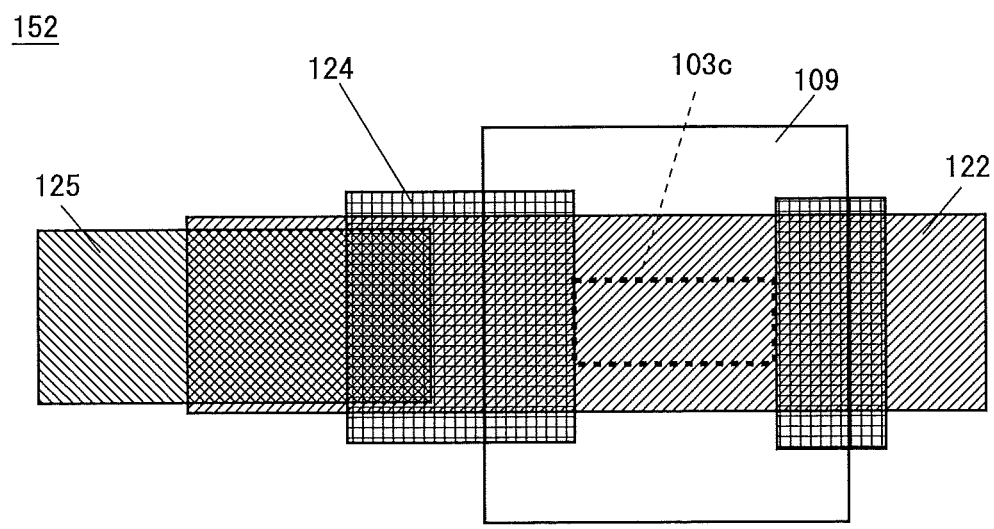

FIG. 10 provides views illustrating the configuration of a line connection structure 152 included in an active-matrix substrate 10a according to a third embodiment; more specifically, FIG. 10(A) is a cross-sectional view of the line connection structure 152, and FIG. 10(B) is a plan view of the line connection structure 152. The line connection structure 152 in the present embodiment, as shown in FIGS. 10(A) and 10(B), is configured in a similar manner to the conventional line connection structure 250 shown in FIGS. 15(A) and 15(B). Therefore, in FIGS. 10(A) and 10(B), elements of the line connection structure 152 that are the same as those of the line connection structure 250 are denoted by the same reference characters, hence any descriptions thereof will be omitted, and different elements will be described.

Figure 15:
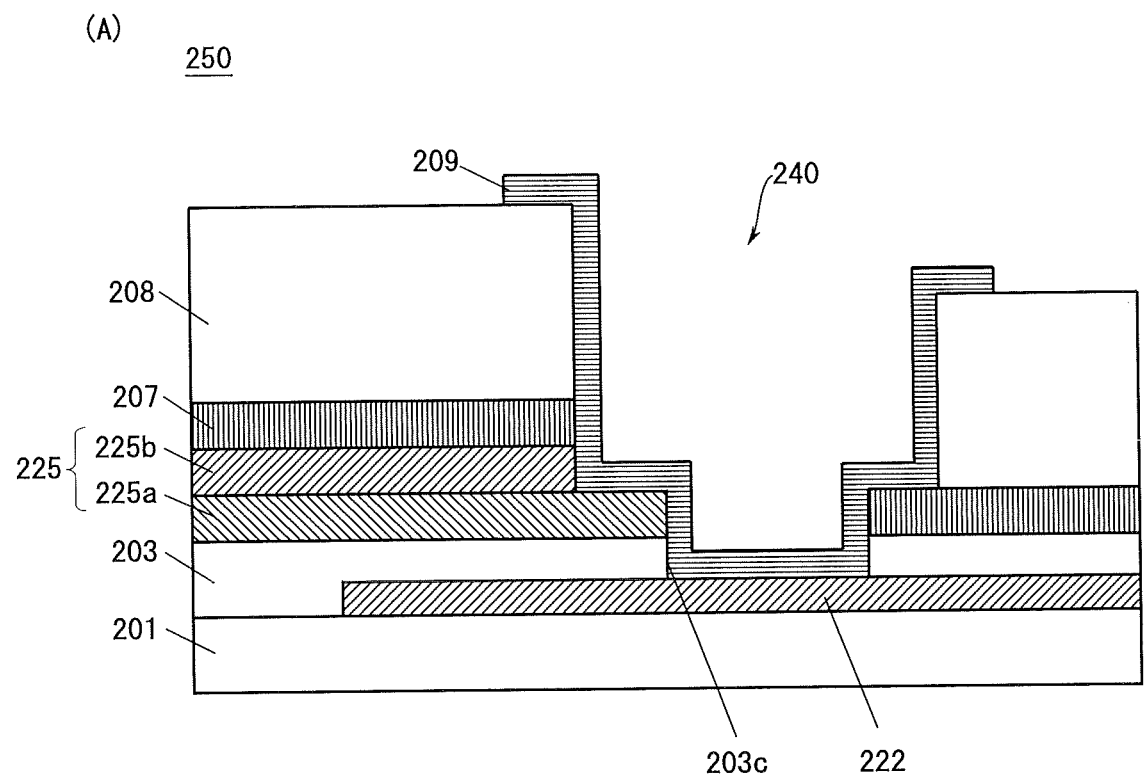
FIG. 15 provides views illustrating a conventional line connection structure; more specifically, part (A) is a cross-sectional view of the conventional line connection structure, and part (B) is a plan view of the conventional line connection structure.
Figure 15:
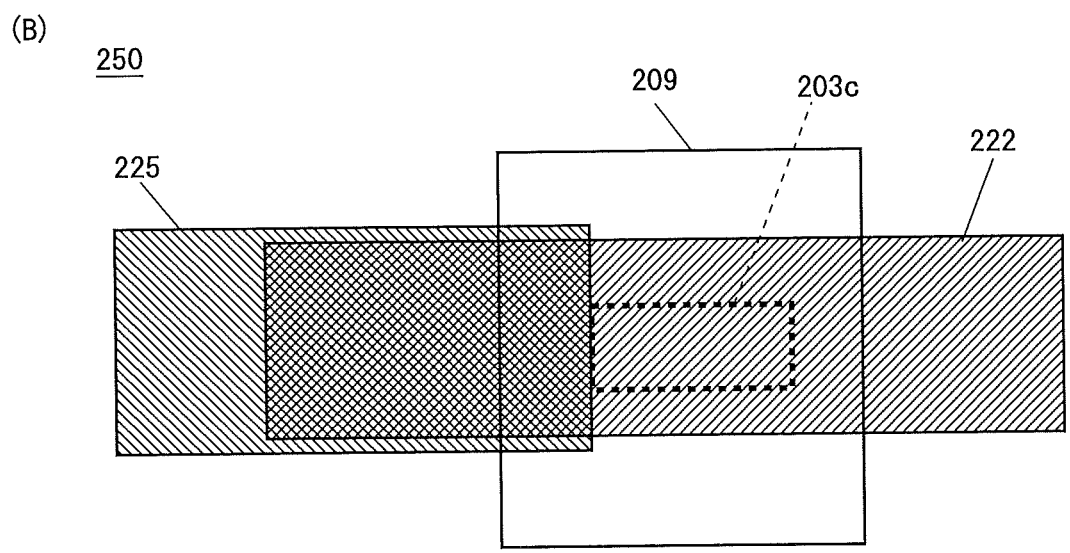

In the line connection structure 152 in the present embodiment, as shown in FIGS. 10(A) and 10(B), unlike in the line connection structure 250 shown in FIGS. 15(A) and 15(B), the end of the second metal line 125 is formed at a position receding from the ends of the passivation layer 107 and the organic insulating film 108. Accordingly, there is a hollow space 130 below the end of the passivation layer 107. Moreover, the ITO layer 109 is formed so as to extend from the surface of the first peripheral portion to the surface of the second peripheral portion and thereby cover the inner surface of the contact hole 140.

In the line connection structure 152, the bottom surface of the aluminum layer 125a included in the second metal line 125 contacts the top surface of the IGZO layer 124 in contact with the ITO layer 109. The ITO layer 109 contacts the top surface of the first metal line 122 within the opening 103c provided in the gate insulating film 103. In this manner, the first metal line 122 and the second metal line 125 are electrically connected via the IGZO layer 124, which serves as a connection line, and the ITO layer 109. Moreover, the aluminum layer 125a included in the second metal line 125 and the ITO layer 109 are isolated from each other by the hollow space 130, and therefore, do not contact each other. Accordingly, no contact fault due to electric corrosion occurs between the aluminum layer 125a and the ITO layer 109. Thus, the first metal line 122 and the second metal line 125 are electrically connected by such a reliable line connection structure 152.

<3.2 Method for Producing the Line Connection Structure>

Figure 11:
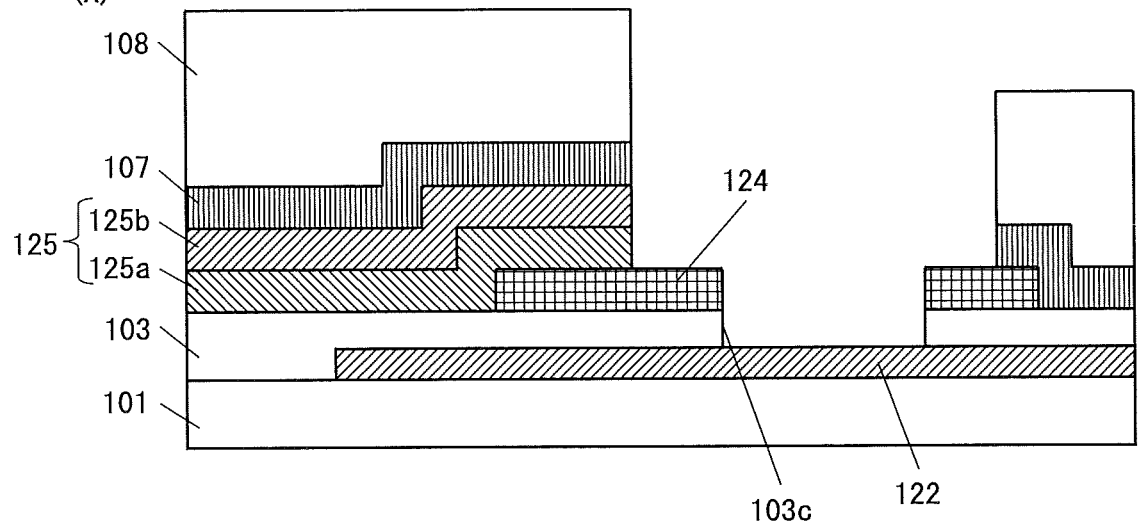
FIGS. 11(A) to 11(C) are cross-sectional views illustrating a method for producing the line connection structure shown in FIG. 10.
Figure 11:
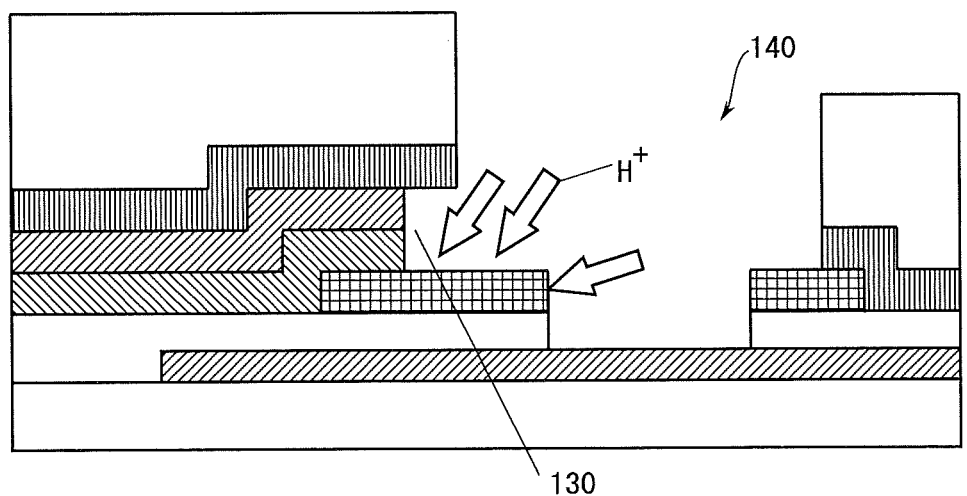
Figure 11:
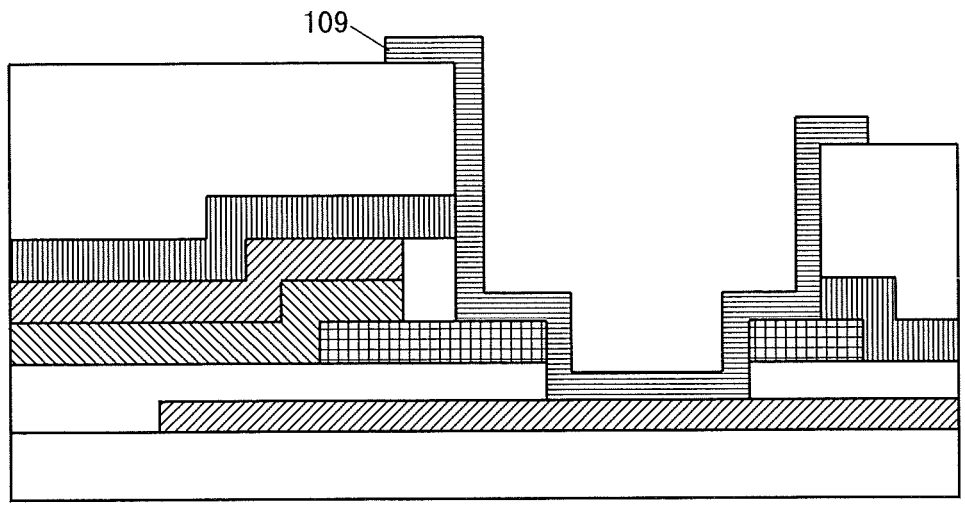

A method for producing the line connection structure 152 in the present embodiment will be described. FIGS. 11(A) to 11(C) provide cross-sectional views illustrating the method for producing the line connection structure 152 shown in FIG. 10. In FIG. 11(A), a first metal line 122 is initially formed on an insulating substrate 101, and thereafter, an aluminum film and a molybdenum nitride film, which constitute a second metal line 125, are formed before a passivation film and an organic insulating film are formed. Next, dry etching is performed with the organic insulating film 108 serving as a mask after the organic insulating film 108 is patterned. By the dry etching, the passivation film, the molybdenum nitride film, and the aluminum film are etched in this order, with the result that the organic insulating film 108, a passivation layer 107, a molybdenum nitride layer 125b, and an aluminum layer 125a are completed along with the contact hole 140.

By further continuing the etching, the gate insulating film 103 is etched with the IGZO layer 124 serving as a mask, with the result that the opening 103c is provided. A top surface of the first metal line 122 is exposed in the opening 103c. At this stage, ends of the molybdenum nitride layer 125b and the aluminum layer 125a included in the second metal line 125 are aligned with ends of the organic insulating film 108 and the passivation layer 107 when viewed in a direction vertical to the insulating substrate 101. Note that at this stage, unlike in the first and second embodiments, the hydrogen plasma treatment for rendering the IGZO layer 124 conductive is not performed.

The end of the second metal line 125 is wet etched so as to recede from the ends of the passivation layer 107 and the organic insulating film 108, as shown in FIG. 11(B). As a result, the passivation layer 107 and the organic insulating film 108 form an overhang below which a hollow space 130 is provided.

Next, the IGZO layer 124 is subjected to a hydrogen plasma treatment using a plasma etching device, whereby the IGZO layer 124 is rendered conductive. At this time, unlike in the first and second embodiments, the surface of the IGZO layer 124 within the hollow space 130 is not covered by the second metal line 125. Accordingly, the IGZO layer 124 is directly exposed to the hydrogen plasma, and hydrogen ions H$^+$ are incident directly on the IGZO layer 124. As a result, the IGZO layer 124 can be reliably rendered conductive, regardless of the length L of the region that corresponds to the second region R2 shown in FIG. 6. Thereafter, an ITO layer 109 is formed so as to cover an inner surface of the contact hole 140, as shown in FIG. 11(C). As a result, the first metal line 122 contacts the ITO layer 109 in contact with the IGZO layer 124, with the result that the first metal line 122 and the second metal line 125 are electrically connected via the IGZO layer 124 and the ITO layer 109.

Furthermore, the organic insulating film 108 to be used as a mask is simply required to be formed such that the ends of the passivation layer 107 and the organic insulating film 108 are positioned on the IGZO layer 124 when the contact hole 140 is provided. Accordingly, when the contact hole 140 is provided, it is possible to set a larger margin of alignment for a resist pattern of the organic insulating film.

In the foregoing, the aluminum layer 125a and the molybdenum nitride layer 125b included in the second metal line 125 are wet etched so as to have the ends thereof receding from the ends of the passivation layer 107 and the organic insulating film 108, as shown in FIG. 11(B). However, only the aluminum layer 125a may be wet etched so as to have only the end thereof receding from the ends of the passivation layer 107 and the organic insulating film 108. In this case also, the IGZO layer 124 within the hollow space 130 is not covered by the aluminum layer 125a, so that the surface thereof is exposed. Thus, the IGZO layer 124 is directly exposed to a hydrogen plasma, whereby the IGZO layer 124 can be reliably rendered conductive.

<3.3 Effects>

The present embodiment renders it possible to achieve the same effects as those described in the first embodiment. Moreover, the present embodiment renders it easy for the IGZO layer 124 to be directly exposed to the hydrogen plasma when the hydrogen plasma treatment is performed, and therefore, the IGZO layer 124 is more reliably rendered conductive. Further, it is possible to set a larger margin of alignment when the contact hole 140 is provided, thereby reducing rework during the process of exposing the organic insulating film to light.

4. Fourth Embodiment

<4.1 Configuration of the Line Connection Structure>

Figure 12:
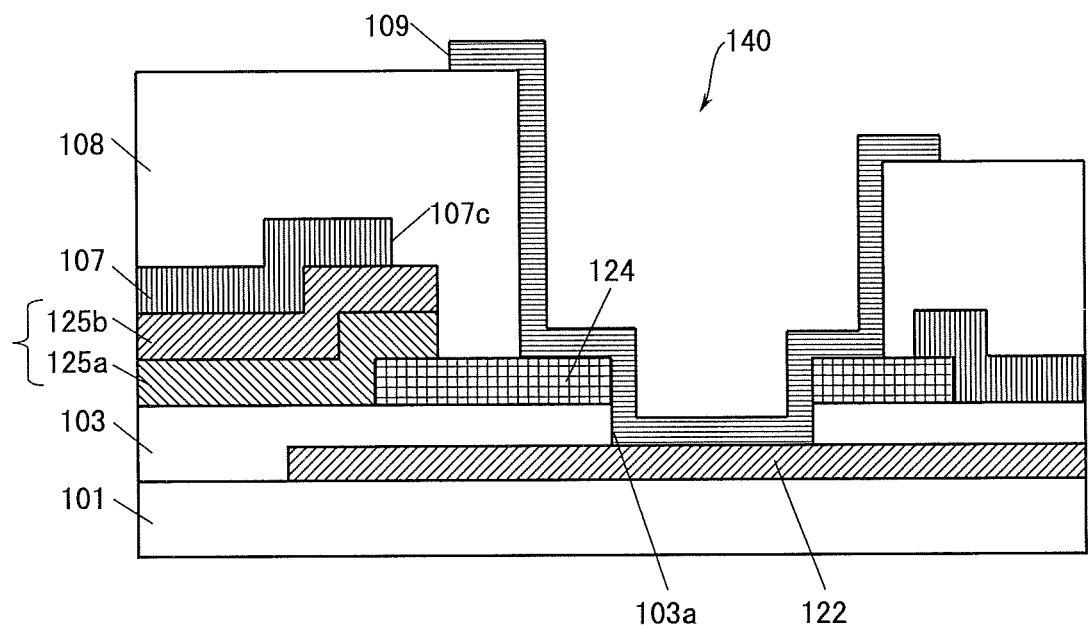
FIG. 12 provides views illustrating the configuration of a line connection structure included in an active-matrix substrate according to a fourth embodiment; more specifically, part (A) is a cross-sectional view of the line connection structure, and part (B) is a plan view of the line connection structure.
Figure 12:
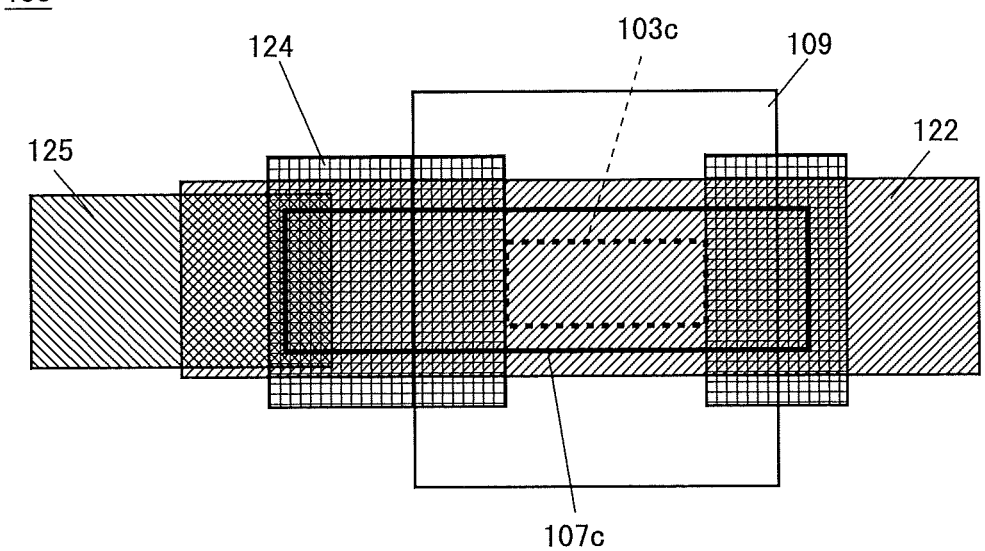

FIG. 12 provides views illustrating the configuration of a line connection structure 153 included in an active-matrix substrate 10a according to a fourth embodiment; more specifically, FIG. 12(A) is a cross-sectional view of the line connection structure 153, and FIG. 12(B) is a plan view of the line connection structure 153. The line connection structure 153 in the embodiment, as shown in FIGS. 12(A) and 12(B), is configured in a similar manner to the line connection structure 151 shown in FIGS. 8(A) and 8(B). Therefore, in FIGS. 12(A) and 12(B), elements of the line connection structure 153 that are the same as those of the line connection structure 151 are denoted by the same reference characters, hence any descriptions thereof will be omitted, and different elements will be described.

In the present embodiment, the end of the passivation layer 107 is formed so as to recede from the end of the second metal line 125, as shown in FIGS. 12(A) and 12(B). Moreover, the organic insulating film 108 is formed so as to cover not only the second metal line 125 but also the passivation layer 107, so that neither the second metal line 125 nor the end of the passivation layer 107 can be seen on the side surface of the contact hole 140. In the line connection structure 153, the organic insulating film 108 is provided between the second metal line 125 and the ITO layer 109, the aluminum layer 125a included in the second metal line 125 does not contact the ITO layer 109. Accordingly, no contact fault due to electric corrosion occurs between the aluminum layer 125a and the ITO layer 109. Thus, the first metal line 122 and the second metal line 125 are electrically connected by such a reliable line connection structure 153.

<4.2 Method for Producing the Line Connection Structure>

Figure 13:
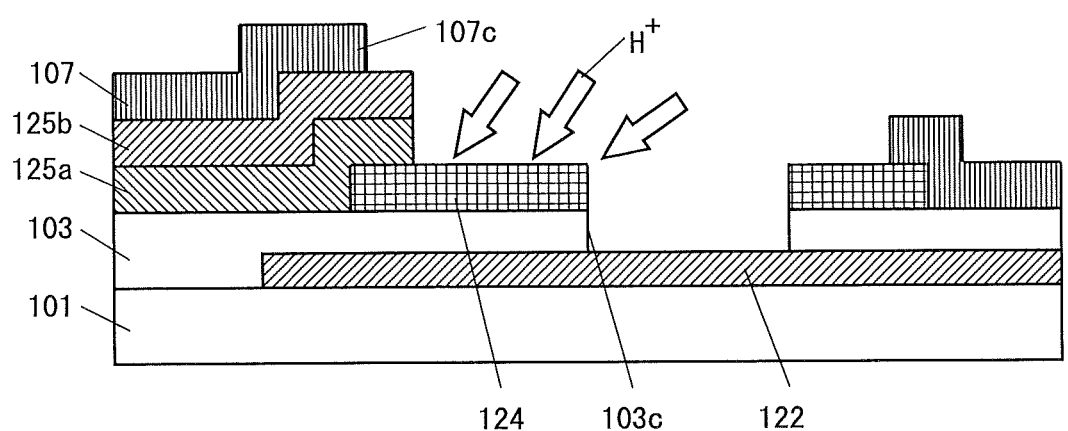
FIGS. 13(A) to 13(C) are cross-sectional views illustrating a method for producing the line connection structure shown in FIG. 12.
Figure 13:
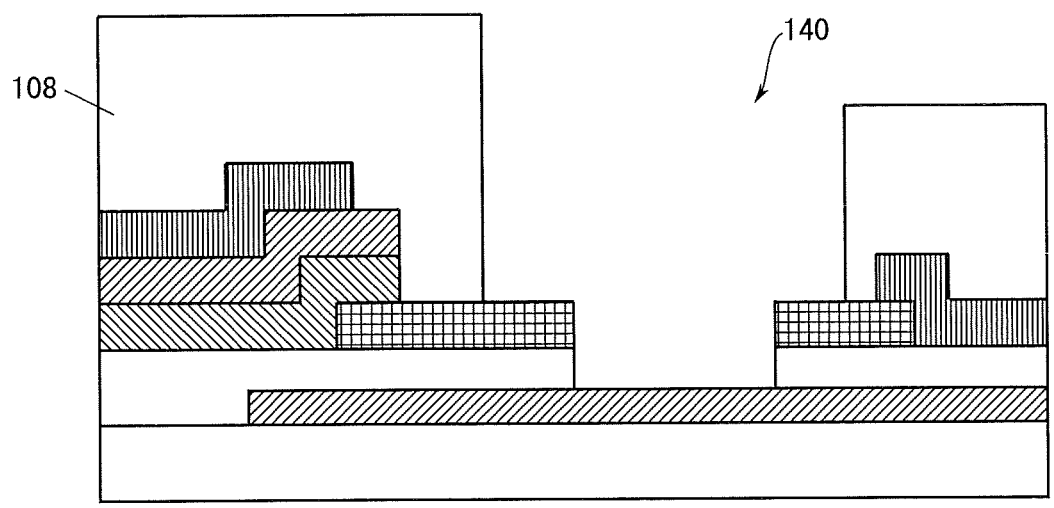
Figure 13:
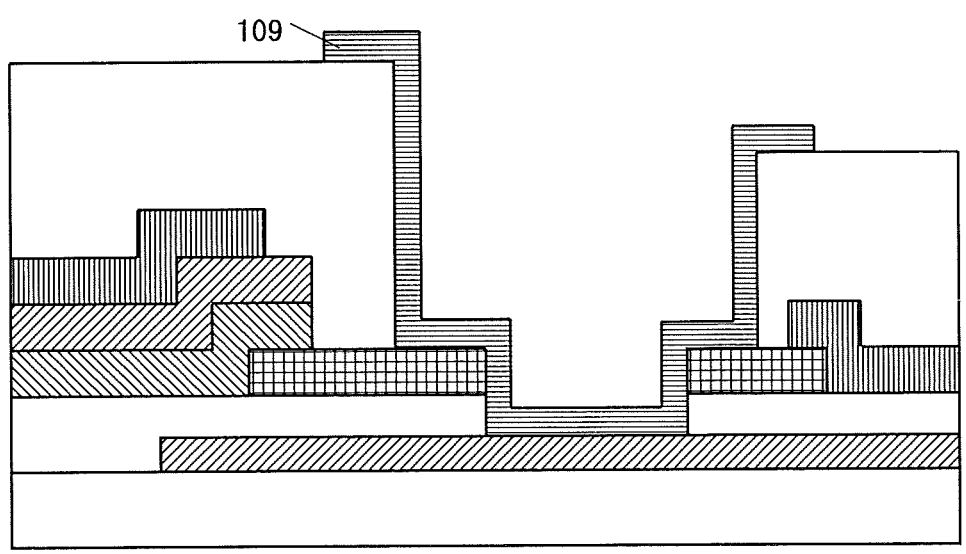

A method for producing the line connection structure 153 according to the present embodiment will be described. FIGS. 13(A) to 13(C) are cross-sectional views illustrating the method for producing the line connection structure 151 shown in FIG. 12. As shown in FIG. 13(A), the procedures from the step of forming the first metal line 122 on the insulating substrate 101 to the step of forming the second metal line 125 are the same as in FIG. 8(A), and therefore, any descriptions thereof will be omitted. A passivation film is formed so as to cover the second metal line 125, and annealed. In this case, since the IGZO layer 124 and the IGZO film that constitutes the channel layer of the TFT 80 are positioned between the gate insulating film 103 and the passivation film, the annealing renders the IGZO layer 124 and the IGZO film semiconductive.

Next, the passivation film is dry etched using a resist pattern as a mask, whereby a passivation layer 107 is formed. In this case, the passivation layer 107 is formed so as to have an end thereof at a position receding from the end of the second metal line 125.

Following the dry etching of the passivation layer, a hydrogen plasma treatment is performed. At this time, while the channel layer 104 of the TFT 80 is covered by the passivation film, the passivation film formed on the IGZO layer 124 has already been removed during the formation of the passivation layer 107, so that the surface of the IGZO layer 124 is exposed. Accordingly, the hydrogen plasma treatment renders conductive the regions of the IGZO layer 124 that respectively correspond to the second and third regions R2 and R3 shown in FIG. 6. Moreover, since the region that corresponds to the first region and covered by the second metal line remains a conductor, the IGZO layer 124 is entirely conductive.

An organic insulating film is formed and patterned, as shown in FIG. 13(B), and thereafter, the organic insulating film 108 is used as a mask for dry etching. As a result, the gate insulating film 103 is etched with the IGZO layer 124, which protrudes into a contact hole 140, serving as a mask, so that an opening 103c is provided.

An ITO film is formed so as to cover an inner surface of the contact hole 140 and dry etched using a resist pattern as a mask, whereby an ITO layer 109 is formed, as shown in FIG. 13(C). As a result, the first metal line 122 contacts the ITO layer 109 in contact with the IGZO layer 124, so that the first metal line 122 and the second metal line 125 are electrically connected via the IGZO layer 124 and the ITO layer 109.

Accordingly, the IGZO layer 124 in the present embodiment is exposed to more hydrogen plasma by a hydrogen plasma treatment than the second region R2 shown in FIG. 6. Thus, the IGZO layer 124 is more reliably rendered conductive.

<4.3 Effects>

The present embodiment renders it possible to achieve the same effects as those described in the first embodiment. Moreover, the IGZO layer 124 can be more reliably rendered conductive by the hydrogen plasma treatment.

<4.4 Variants>

The features of the present embodiment can be applied to any of the first through third embodiments, and in any case, effects similar to those achieved by the present embodiment can be achieved.

5. Fifth Embodiment

Figure 14:
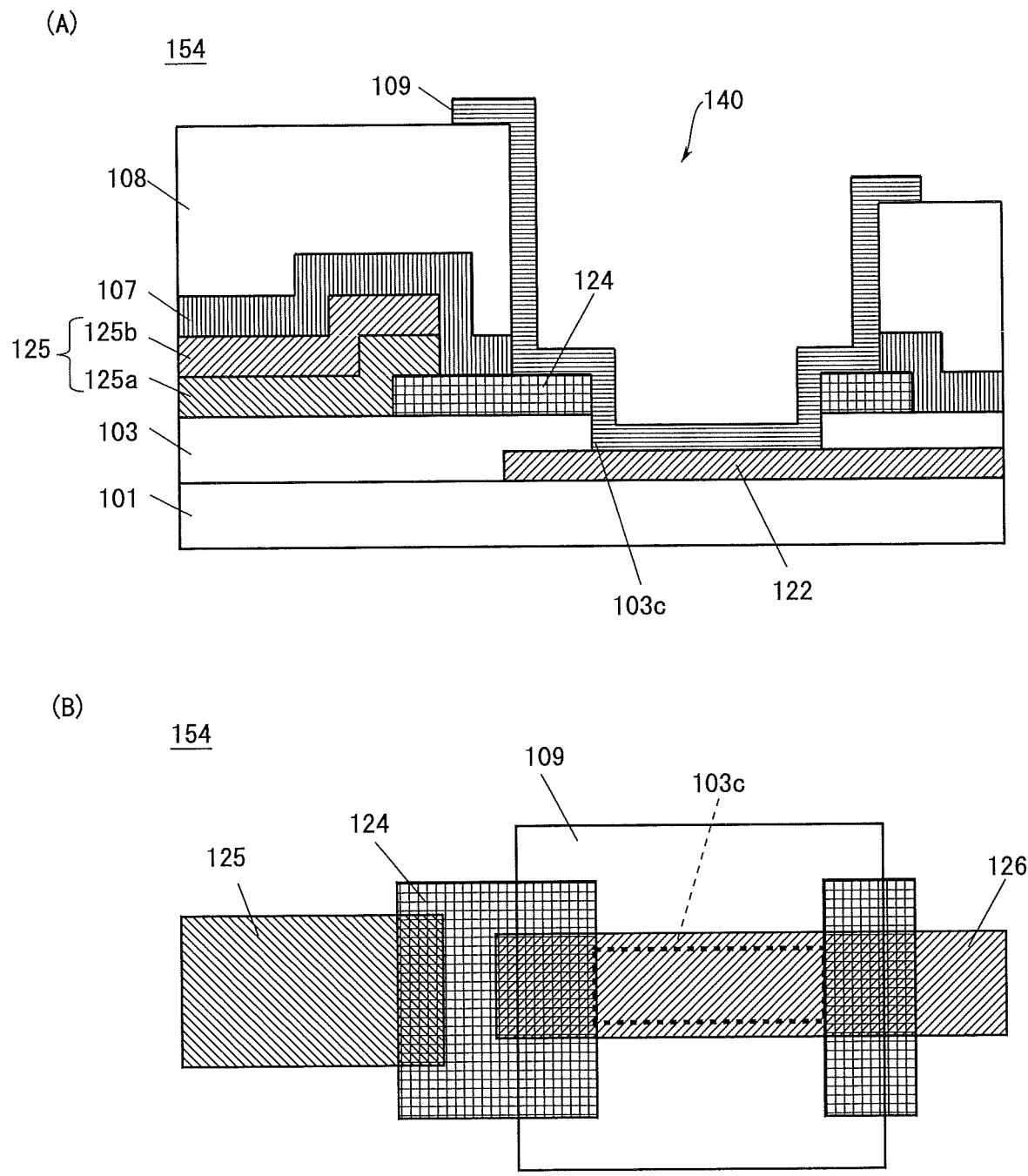
FIG. 14 provides views illustrating the configuration of a line connection structure included in an active-matrix substrate according to a fifth embodiment; more specifically, part (A) is a cross-sectional view of the line connection structure, and part (B) is a plan view of the line connection structure.

FIG. 14 provides views illustrating the configuration of a line connection structure 154 included in an active-matrix substrate 10a according to a fifth embodiment; more specifically, FIG. 14(A) is a cross-sectional view of the line connection structure 154, and FIG. 14(B) is a plan view of the line connection structure 154. The line connection structure 154 in the present embodiment, as shown in FIGS. 14(A) and 14(B), is configured in a similar manner to the line connection structure 151 shown in FIG. 8. Therefore, in FIGS. 14(A) and 14(B), elements of the line connection structure 154 that are the same as those of the line connection structure 151 are denoted by the same reference characters, hence any descriptions thereof will be omitted, and different elements will be described.

The line connection structure 154 in the present embodiment, as shown in FIGS. 14(A) and 14(B), is the same as the line connection structure 151 shown in FIGS. 8(A) and 8(B), except that the first metal line 122 and the second metal line 125 do not overlap at all when viewed in a direction vertical to the insulating substrate 101. Accordingly, described are problems that might be caused where the first metal line 122 and the second metal line 125 overlap even to a slight degree when viewed in a direction vertical to the insulating substrate 101.

For example, in the case where the second metal line 125 is electrostatically charged during the step of dry etching the second metal line 125, a voltage applied between the second metal line 125 and the first metal line 122 might become higher than a dielectric withstand voltage of the gate insulating film 103 disposed between the second metal line 125 and the first metal line 122. In such a case, the static electricity charging the second metal line 125 might be discharged toward the first metal line 122, with the result that electrostatic discharge damage occurs whereby the gate insulating film 103 disposed between the second metal line 125 and the first metal line 122 is broken. Consequently, this causes the problem where the first metal line 122 and the second metal line 125 are electrically connected.

Accordingly, the first metal line 122 and the second metal line 125 are formed so as not to overlap at all when viewed in a direction vertical to the insulating substrate 101, as in the present embodiment. As a result, the distance therebetween can be increased, whereby the occurrence of electrostatic discharge damage is suppressed. Note that the first metal line 122 and the second metal line 125 are preferably formed not only so as not to overlap at all when viewed in a direction vertical to the insulating substrate 101 but also so as to have respective ends distanced from each other as much as possible.

<5.1 Effects>

The present embodiment renders it possible to achieve the same effects as those described in the first embodiment. Moreover, the first metal line 122 and the second metal line 125 are formed so as not to overlap depthwise, whereby the occurrence of electrostatic discharge damage can be suppressed.

<5.2 Variants>

The features of the present embodiment can be applied not only to the second embodiment but also to any of the first, third, and fourth embodiments, and in any case, effects similar to those achieved by the present embodiment can be achieved.

<6. Other>

Furthermore, the embodiments have been described taking aluminum and ITO as an example of the combination of metals for which a contact fault due to electric corrosion occurs. However, there are other combinations of metals that can suffer from electric corrosion, including silver (Ag) and ITO. Also for cases in which the line connection structure uses a line including silver or a silver alloy as the first or second metal line and also uses an ITO layer as a connection line for such metal lines, by employing the line connection structures 150 to 154 in the embodiments, it is possible to prevent the occurrence of a contact fault due to electric corrosion.

In the first through fifth embodiments, the side surface of the contact hole 140 has a large height difference of 2 to 3 µm, and therefore, when the ITO film is formed by sputtering, the ITO film is broken in some places. However, such breakage of the ITO film occurs only in some portions, and electrical conductivity is ensured in portions around such broken portions, so that no problems are caused in any of the line connection structures 150 to 154.

The embodiments have been described taking as an example the liquid crystal display device. However, the display device to which the present invention can be applied is not limited to the liquid crystal display device, and the invention can also be applied to organic EL (electroluminescent) and microelectromechanical display devices including active-matrix substrates with TFTs provided in pixel forming portions.

This application claims priority to Japanese Patent Application No. 2016-94281, filed Aug. 27, 2015 and titled "Active Matrix Substrate, Method for Producing Same, and Display Device", the content of which is incorporated herein by reference.

DESCRIPTION OF THE REFERENCE CHARACTERS 10 liquid crystal display device
10a active-matrix substrate
20 liquid crystal panel
30 scanning signal line driver circuit
40 data signal line driver circuit
70 pixel forming portion
80 thin-film transistor (TFT)
103 gate insulating film
103c opening
104 channel layer
107 passivation layer (protective film)
108 organic insulating film
122 first metal line
124 oxide semiconductor layer
125 second metal line
109 third metal line (ITO layer)
130 hollow space
140 contact hole
150 to 154 line connection structure

The invention claimed is:

1. An active-matrix substrate comprising:
a first metal line on an insulating substrate;
a first insulating film on the first metal line and including a first opening;
a conductive oxide semiconductor layer on the first insulating film;
a second metal line connected to an end of the conductive oxide semiconductor layer;
a second insulating film covering at least a top surface of the second metal line and including a second opening vertically above the first opening; and
a third metal line on an inner surface of the second opening, wherein,
the first metal line is vertically below the first opening,
the second metal line is vertically below the second insulating film and does not overlap the second opening,
the conductive oxide semiconductor layer contacts the second metal line in a region vertically below the second insulating film and extends to a region within the first opening, and
the third metal line overlaps the first metal line within the first opening and contacts the conductive oxide semiconductor layer within the second opening such that the first metal line and the second metal line are electrically connected via at least the conductive oxide semiconductor layer, wherein
the first metal line contacts the conductive oxide semiconductor layer within the first opening such that the first metal line and the second metal line are electrically connected via the conductive oxide semiconductor layer, and the second metal line and the third metal line are isolated by the second insulating film.

2. The active-matrix substrate according to claim 1, wherein,
the second insulating film includes a protective film protecting the second metal line and an organic insulating film formed on the protective film, and
the protective film is formed at a position more distant from the second opening than is an end of the second metal line.

3. The active-matrix substrate according to claim 1, wherein the first metal line and the second metal line are formed so as not to overlap when viewed in a direction vertical to the insulating substrate.

4. A display device comprising:
a display panel including an active-matrix substrate of claim 1 and a substrate bonded so as to be opposed to the active-matrix substrate;
a scanning signal line driver circuit configured to sequentially select a plurality of scanning signal lines; and
a data signal line driver circuit configured to write image signal voltages to a plurality of data signal lines, the image signal voltages being generated on the basis of externally inputted image data, wherein,
the active-matrix substrate includes the scanning signal lines, the data signal lines, each crossing the scanning signal lines, and a plurality of pixel forming portions disposed corresponding to intersections of the scanning signal lines and the data signal lines,
the pixel forming portion includes a channel-etched thin-film transistor having a channel layer and the second insulating film formed on the channel layer, the channel layer being made of an oxide semiconductor rendered semiconductive, and
the oxide semiconductor layer has first, second, and third regions, the first region being covered by the second metal line, the second region being positioned between the first and third regions and having the second insulating film on a top surface, the third region lying vertically below the second opening, and the second region has a length less than a thickness of the second insulating film formed on the thin-film transistor.

5. An active-matrix substrate comprising:
a first metal line on an insulating substrate;
a first insulating film on the first metal line and including a first opening;
a conductive oxide semiconductor layer on the first insulating film;
a second metal line connected to an end of the conductive oxide semiconductor layer;
a second insulating film covering at least a top surface of the second metal line and including a second opening vertically above the first opening; and
a third metal line on an inner surface of the second opening, wherein,
the first metal line is vertically below the first opening, the second metal line is vertically below the second insulating film and does not overlap the second opening, the conductive oxide semiconductor layer contacts the second metal line in a region vertically below the second insulating film and extends to a region within the first opening, and the third metal line overlaps the first metal line within the first opening and contacts the conductive oxide semiconductor layer within the second opening such that the first metal line and the second metal line are electrically connected via at least the conductive oxide semiconductor layer, wherein the first metal line contacts the third metal line within the first opening, and the third metal line is connected to the conductive oxide semiconductor layer within the second opening such that the first metal line and the second metal line are electrically connected via the third metal line and the conductive oxide semiconductor layer, and the second metal line and the third metal line are isolated by the second insulating film.

6. The active-matrix substrate according to claim 5, wherein, the second insulating film includes a protective film protecting the second metal line and an organic insulating film formed on the protective film, and the protective film is formed at a position more distant from the second opening than is an end of the second metal line.

7. The active-matrix substrate according to claim 5, wherein the first metal line and the second metal line are formed so as not to overlap when viewed in a direction vertical to the insulating substrate.

8. An active-matrix substrate comprising:

a first metal line on an insulating substrate;

a first insulating film on the first metal line and including a first opening;

a conductive oxide semiconductor layer on the first insulating film;

a second metal line connected to an end of the conductive oxide semiconductor layer;

a second insulating film covering at least a top surface of the second metal line and including a second opening vertically above the first opening; and a third metal line on an inner surface of the second opening, wherein, the first metal line is vertically below the first opening, the second metal line is vertically below the second insulating film and does not overlap the second opening, the conductive oxide semiconductor layer contacts the second metal line in a region vertically below the second insulating film and extends to a region within the first opening, and the third metal line overlaps the first metal line within the first opening and contacts the conductive oxide semiconductor layer within the second opening such that the first metal line and the second metal line are electrically connected via at least the conductive oxide semiconductor layer, wherein the second metal line includes an end that is more distant from the second opening than is an end of the second insulating film such that a hollow space is provided between the end of the second metal line and the second insulating film.

9. The active-matrix substrate according to claim 8, wherein, the second insulating film includes a protective film protecting the second metal line and an organic insulating film formed on the protective film, and the protective film is formed at a position more distant from the second opening than is an end of the second metal line.

10. The active-matrix substrate according to claim 8, wherein the first metal line and the second metal line are formed so as not to overlap when viewed in a direction vertical to the insulating substrate.

* * * * *